(12) United States Patent
Hiramoto et al.

(10) Patent No.: US 8,767,114 B2
(45) Date of Patent: Jul. 1, 2014

(54) SOLID-STATE IMAGING ELEMENT AND IMAGING DEVICE

(75) Inventors: Masao Hiramoto, Osaka (JP); Masaaki Suzuki, Osaka (JP)

(73) Assignee: Panasonic Corporation, Osaka (JP)

( * ) Notice: Subject to any disclaimer, the term of this patent is extended or adjusted under 35 U.S.C. 154(b) by 189 days.

(21) Appl. No.: 13/502,408

(22) PCT Filed: Apr. 22, 2011

(86) PCT No.: PCT/JP2011/002381
§ 371 (c)(1),
(2), (4) Date: Apr. 17, 2012

(87) PCT Pub. No.: WO2012/026050
PCT Pub. Date: Mar. 1, 2012

(65) Prior Publication Data
US 2012/0212656 A1    Aug. 23, 2012

(30) Foreign Application Priority Data
Aug. 24, 2010   (JP) .................................. 2010-187251

(51) Int. Cl.
*H04N 9/07*   (2006.01)

(52) U.S. Cl.
USPC ......................................... 348/336; 348/294

(58) Field of Classification Search
CPC ....... H04N 5/335; H04N 5/378; H04N 3/155; H04N 9/045; H01L 27/14643
USPC .................................................. 348/294, 336
See application file for complete search history.

(56) References Cited

U.S. PATENT DOCUMENTS

| 7,245,324 B2 * | 7/2007 | Namazue et al. ............. 348/340 |
| 7,405,759 B2 * | 7/2008 | Radl .............................. 348/336 |
| 8,330,840 B2 * | 12/2012 | Lenchenkov ................. 348/294 |

(Continued)

FOREIGN PATENT DOCUMENTS

| JP | 59-090467 A | 5/1984 |
| JP | 2000-151933 A | 5/2000 |
| JP | 2001-309395 A | 11/2001 |
| JP | 2003/078917 A | 3/2003 |
| JP | 2007-259232 A | 10/2007 |
| WO | 2009/153937 A1 | 12/2009 |
| WO | 2010/058545 A1 | 5/2010 |
| WO | 2010/070869 A1 | 6/2010 |

OTHER PUBLICATIONS

International Search Report for corresponding International Application No. PCT/JP2011/002381 mailed Jun. 7, 2011.
Form PCT/ISA/237 for corresponding International Application No. PCT/JP2011/002381 mailed Jun. 7, 2011 and Partial English translation.

*Primary Examiner* — Twyler Haskins
*Assistant Examiner* — Fayez Bhuiyan
(74) *Attorney, Agent, or Firm* — Renner, Otto, Boisselle & Sklar, LLP

(57) ABSTRACT

The solid-state image sensor of the present invention includes an array of photosensitive cells, an array 100 of dispersing elements, and an array 300 of color filters. The photosensitive cell array 200 has a number of unit blocks 40, each of which includes photosensitive cells 2a and 2b. The dispersing element array 100 includes a dispersing element 1a, which makes all of incoming light (W) but a light ray falling within a first wavelength range incident on the first photosensitive cell 2a and which also makes at least a part of the light ray falling within the first wavelength range incident on the second photosensitive cell 2b. A color filter 3a that either absorbs or reflects the light ray falling within the first wavelength range is arranged between the photosensitive cell 2a and the dispersing element 1a.

11 Claims, 14 Drawing Sheets

(56) References Cited

U.S. PATENT DOCUMENTS

| | | |
|---|---|---|
| 2002/0005471 A1 | 1/2002 | Suzuki |
| 2003/0063204 A1* | 4/2003 | Suda .............................. 348/272 |
| 2007/0097252 A1* | 5/2007 | Silverstein .................... 348/336 |
| 2007/0221829 A1 | 9/2007 | Nakagawa et al. |
| 2010/0019129 A1* | 1/2010 | Ishigaki et al. ............ 250/208.1 |
| 2010/0188537 A1 | 7/2010 | Hiramoto et al. |
| 2011/0037869 A1 | 2/2011 | Hiramoto et al. |
| 2011/0050941 A1 | 3/2011 | Hiramoto et al. |

* cited by examiner (PHOTOSENSING SECTION)   (PHOTOSENSING SECTION)

SOLID-STATE IMAGING ELEMENT AND IMAGING DEVICE

TECHNICAL FIELD

The present invention relates to a technique for increasing the sensitivity of a solid-state image sensor and realizing color representation using such a solid-state image sensor.

BACKGROUND ART

Recently, the performance and functionality of digital cameras and digital movie cameras that use some solid-state image sensor such as a CCD and a CMOS (which will be simply referred to herein as an "image sensor") have been enhanced to an astonishing degree. In particular, the size of a pixel structure for use in an image sensor has been further reduced these days thanks to rapid development of semiconductor device processing technologies, thus getting an even greater number of pixels and drivers integrated together in an image sensor. And the performance of image sensors has been further enhanced as well. Meanwhile, cameras that use a backside illumination type image sensor, which receives incoming light on its back surface side, not on its principal surface side with a wiring layer for the solid-state image sensor, have been developed just recently and their property has attracted a lot of attention these days. Nevertheless, the greater the number of pixels in an image sensor, the lower the intensity of the light falling on a single pixel and the lower the sensitivity of camera tends to be.

The sensitivity of cameras has dropped recently due to not only such a significant increase in resolution but also the use of a color-separating color filter itself. In an ordinary color camera, a subtractive color filter that uses an organic pigment as a dye is arranged to face each photosensitive cell of an image sensor. A color filter transmits one color component of incoming light to use but absorbs the other components of the light. That is why with such a color filter, the optical efficiency of a camera would decrease. Specifically, in a color camera that uses a Bayer color filter arrangement in which color filters in three colors are arranged using a combination of one red (R) element, two green (G) elements and one blue (B) element as a fundamental unit, the R color filter transmits only a light ray falling within the red wavelength range (i.e., an R ray) but absorbs the other rays, the G color filter transmits only a light ray falling within the green wavelength range (i.e., a G ray) but absorbs the other rays, and the B color filter transmits only a light ray falling within the blue wavelength range (i.e., a B ray) but absorbs the other rays. Consequently, the sum of the quantities of light that can be used by a color camera with the Bayer arrangement is approximately only one-third of the entire incoming light.

To overcome such a decreased sensitivity problem, Patent Document No. 1 discloses a technique for increasing the quantity of the light received by attaching an array of micro lenses to a photodetector section of an image sensor so that a greater percentage of the incoming light can be used. According to this technique, the incoming light is condensed with those micro lenses, thereby substantially increasing the optical aperture ratio of the image sensor. And this technique is now used in almost all solid-state image sensors. It is true that the aperture ratio can be increased substantially by this technique but the decrease in optical efficiency by color filters still persists.

Thus, to avoid the decrease in optical efficiency and the decrease in sensitivity at the same time, Patent Document No. 2 discloses a technique for taking in as much incoming light as possible by using multilayer color filters (as dichroic mirrors) and micro lenses in combination. Such a technique uses a combination of dichroic mirrors, each of which does not absorb light but selectively transmits only a component of light falling within a particular wavelength range and reflects the rest of the light falling within the other wavelength ranges. As a result, only a required component of the incoming light falling within a particular wavelength range can be incident on each photosensing section with causing a significant loss of the incoming light.

FIG. 13 schematically illustrates a cross section of the image sensor of Patent Document No. 2 as viewed on a plane that intersects with its imaging area at right angles. This image sensor includes two condensing micro lenses 4a and 4b, which are respectively arranged on the surface and inside of the image sensor, an opaque member 20, photosensitive cells 2a, 2b, and 2c, and dichroic mirrors 17, 18 and 19, which are arranged so as to face photosensitive cells 2a, 2b and 2c, respectively. The dichroic mirror 17 has such a property as to transmit an R ray and reflect G and B rays. The dichroic mirror 18 has such a property as to reflect a G ray and transmit R and B rays. And the dichroic mirror 19 has such a property as to reflect a B ray and transmit R and G rays.

The light that has impinged on the micro lens 4a has its luminous flux adjusted by the micro lens 4b, and then enters the first dichroic mirror 17, which transmits an R ray but reflects G and B rays. The light ray that has been transmitted through the first dichroic mirror 17 is then incident on the photosensitive cell 2a. On the other hand, the G and B rays that have been reflected from the first dichroic mirror 17 enter the second dichroic mirror 18 adjacent to the first dichroic mirror 17. The second dichroic mirror 18 reflects the G ray of the incoming light and transmits its B ray. The G ray that has been reflected from the second dichroic mirror 18 is incident on the photosensitive cell 2b. On the other hand, the B ray that has been transmitted through the second dichroic mirror 18 is reflected from the third dichroic mirror 19 and then incident on the photosensitive cell 2c that is located right under the dichroic mirror 19. In this manner, in the image sensor disclosed in Patent Document No. 2, the visible radiation that has impinged on the condensing micro lens 4a is not absorbed into color filters but their RGB components can be detected by the three photosensitive cells non-wastefully.

Meanwhile, Patent Document No. 3 discloses an image sensor that can minimize the loss of light by using a micro prism. Such an image sensor has a structure in which the incoming light is dispersed by the micro prism into R, G and B rays to be received by three different photosensitive cells. Even when such an image sensor is used, the optical loss can also be minimized.

According to the techniques disclosed in Patent Documents Nos. 2 and 3, however, the number of photosensitive cells to provide needs to be as many as that of the dichroic mirrors to use or that of the color components to produce by dispersing the incoming light. That is why to detect light rays in the three primary colors of RGB, for example, the number of photosensitive cells provided should be tripled compared to a situation where conventional color filters are used, which is a problem.

Thus, to overcome such problems with the prior art, Patent Document No. 4 discloses a technique for increasing the optical efficiency by using dichroic mirrors, although some loss of the incoming light is involved. FIG. 14 is a partial cross-sectional view of an image sensor that adopts such a technique. As shown in FIG. 14, dichroic mirrors 22 and 23 are embedded in a light-transmitting resin 21. Specifically, the dichroic mirror 22 has such a property as to transmit a G ray and reflect R and B rays, while the dichroic mirror 23 has such a property as to transmit an R ray and reflect G and B rays.

Such a structure cannot receive a B ray at its photosensing section but can sense R and G rays entirely under the following principle. First, if an R ray impinges on the dichroic mirrors 22 and 23, the R ray is reflected from the dichroic mirror 22 but transmitted through the dichroic mirror 23. The R ray that has been reflected from the dichroic mirror 22 is also reflected from the interface between the light-transmitting resin 21 and the air, and then strikes the dichroic mirror 23. Then, the R ray is transmitted through the dichroic mirror 23 and then also transmitted through an organic dye filter 25 and a micro lens 26 that transmit the R ray. In this manner, even though only a part of the light is reflected from a metal layer 27, almost all of the R ray that has impinged on the dichroic mirrors 22 and 23 is incident on the photosensing section. On the other hand, if a G ray impinges on the dichroic mirrors 22 and 23, the G ray is transmitted through the dichroic mirror 22 but reflected from the dichroic mirror 23. The G ray that has been reflected from the dichroic mirror 23 is also totally reflected from the interface between the light-transmitting resin 21 and the air, and then strikes the dichroic mirror 22. Then, the G ray is transmitted through the dichroic mirror 22 and then also transmitted through an organic dye filter 24 and a micro lens 26 that transmit the G ray. In this manner, even though only a part of the light is reflected from the metal layer 27, almost all of the G ray that has impinged on the dichroic mirrors 22 and 23 is incident on the photosensing section almost without causing loss.

According to the technique disclosed in Patent Document No. 4, only one of the three color rays of RGB is lost but light rays of the other two colors can be received with almost no loss based on the principle described above. That is why there is no need to provide photosensing sections for all of the three colors of RGB. In this case, comparing such an image sensor to the one that does not use any dichroic mirrors but uses only organic dye filters to realize a color representation, it can be seen that the image capturing sensitivity can be doubled by this technique. This is because the optical efficiency achieved by using only organic dye filters is approximately one-third but the optical efficiency achieved by adopting the technique disclosed in Patent Document No. 4 is approximately two-thirds of the entire incoming light. Nevertheless, even if such a technique is adopted, the optical efficiency cannot be 100% since one out of the three colors should be sacrificed.

Furthermore, Patent Document No. 5 discloses a color representation technique for improving, by providing dispersing elements for photosensitive cells, the optical efficiency without significantly increasing the number of photosensitive cells to use. According to such a technique, each of the dispersing elements provided for the photosensitive cells disperses the incoming light into multiple light rays and makes those light rays incident on the photosensitive cells according to their wavelength ranges. In this case, each of the photosensitive cells receives combined light rays, in which multiple components falling within mutually different wavelength ranges have been superposed one upon the other, from multiple dispersing elements. As a result, a color signal can be generated by performing a signal arithmetic operation on the photoelectrically converted signals supplied from the respective photosensitive cells.

CITATION LIST

Patent Literature

Patent Document No. 1: Japanese Patent Application Laid-Open Publication No. 59-90467
Patent Document No. 2: Japanese Patent Application Laid-Open Publication No. 2000-151933
Patent Document No. 3: Japanese Patent Application Laid-Open Publication No. 2001-309395
Patent Document No. 4: Japanese Patent Application Laid-Open Publication No. 2003-78917
Patent Document No. 5: PCT International Application Publication No. 2009/153937

SUMMARY OF INVENTION

Technical Problem

To sum up, according to the conventional technologies, if light-absorbing color filters are used, the number of photosensitive cells to provide does not have to be increased significantly but the optical efficiency achieved will be low. Nevertheless, if dichroic mirrors or micro prisms are used as in the techniques disclosed in Patent Document Nos. 2 and 3, then the optical efficiency will be high but the number of photosensitive cells to provide should be increased considerably.

Meanwhile, according to the technique disclosed in Patent Document No. 5, a color image can be certainly obtained with the optical efficiency improved, theoretically speaking. However, it is difficult to make a dispersing element with an ideal dispersing property. And if the material property and product precision of the dispersing element are low, then the photoelectrically converted signal to be eventually output from each photosensitive cell does not become an ideal signal, either, and the color reproducibility of the resultant color image will be low, which is a serious problem.

It is therefore an object of the present invention to provide a color image capturing technique that contributes to not only improving the optical efficiency without increasing the number of photosensitive cells to provide significantly but also achieving higher color reproducibility than in the prior art.

Solution to Problem

A solid-state image sensor according to the present invention includes: a photosensitive cell array, in which a number of unit blocks, each including first and second photosensitive cells, are arranged two-dimensionally on an imaging area; a dispersing element array that is arranged so as to face the photosensitive cell array and that includes a plurality of dispersing elements; and a color filter array, that is arranged between the photosensitive cell array and the dispersing element array and that includes a plurality of color filters. If light that would be directly incident on each photosensitive cell, were it not for the dispersing element array and the color filter array, is called that photosensitive cell's entering light and if the first photosensitive cell's entering light includes light rays that fall within first, second and third wavelength ranges, the dispersing element array includes a first dispersing element that is arranged to face the first photosensitive cell and that makes at least a part of the light rays falling within the first wavelength range included in the first cell's entering light incident on the second photosensitive cell. And the dispersing element array is designed to make light rays falling within at least two ranges of the first wavelength range, the second wavelength range and the third wavelength range incident on at least one of the first and second photosensitive cells. The color filter array includes a first color filter that is arranged between the first photosensitive cell and the first dispersing element, and that either absorbs or reflects the light rays falling within the first wavelength range.

In one preferred embodiment, the first dispersing element makes a part of the light rays falling within the first wavelength range included in the first photosensitive cell's entering light incident on the second photosensitive cell and another part of the light rays falling within the first wavelength range included in the first photosensitive cell's entering light incident on the second photosensitive cell of an adjacent unit block.

In another preferred embodiment, the solid-state image sensor further includes a second dispersing element that is arranged to face the second photosensitive cell. The first dispersing element makes the light ray that falls within the first wavelength range incident on the second photosensitive cell, makes the light ray that falls within the second wavelength range incident on the second photosensitive cell of an adjacent unit block, and makes the light ray that falls within the third wavelength range incident on its associated first photosensitive cell. The second dispersing element makes a part of the light rays falling within the second wavelength range that are included in the second photosensitive cell's entering light incident on its associated first photosensitive cell, makes another part of the light rays falling within the second wavelength range that are included in the second photosensitive cell's entering light incident on the first photosensitive cell of another adjacent unit block, and makes the light rays falling within the first and third wavelength ranges incident on its associated second photosensitive cell.

In this particular preferred embodiment, each unit block further includes third and fourth photosensitive cells. The dispersing element array further includes third and fourth dispersing elements. The third dispersing element is arranged to face the third photosensitive cell. The third dispersing element makes light rays falling within one of the first and second wavelength ranges that are included in the third photosensitive cell's entering light incident on its associated fourth photosensitive cell, makes light rays falling within the other one of the first and second wavelength ranges that are included in the third photosensitive cell's entering light incident on the fourth photosensitive cell of that another adjacent unit block, and makes light rays falling within the third wavelength range incident on its associated third photosensitive cell. The fourth dispersing element is arranged to face the fourth photosensitive cell. The fourth dispersing element makes a part of the light rays falling within the first wavelength range that are included in the fourth photosensitive cell's entering light incident on its associated third photosensitive cell, makes another part of the light rays falling within the first wavelength range that are included in the fourth photosensitive cell's entering light incident on the third photosensitive cell of the adjacent unit block, and makes the light rays falling within the second and third wavelength ranges incident on its associated fourth photosensitive cell. The color filter array includes a second color filter that is arranged between the third photosensitive cell and the third dispersing element, and that either absorbs or reflects the light ray falling within the second wavelength range.

In another preferred embodiment, each unit block further includes third and fourth photosensitive cells. The dispersing element array further includes a second dispersing element arranged to face the fourth photosensitive cell. The second dispersing element makes a part of the light rays falling within the second wavelength range that are included in the second photosensitive cell's entering light incident on its associated third photosensitive cell, makes another part of the light rays falling within the second wavelength range that are included in the second photosensitive cell's entering light incident on the third photosensitive cell of another adjacent unit block, and makes light rays falling within the first and third wavelength ranges incident on its associated fourth photosensitive cell. The color filter array includes a second color filter that is arranged between the fourth photosensitive cell and the second dispersing element, and that either absorbs or reflects the light ray falling within the second wavelength range.

In still another preferred embodiment, each unit block further includes third and fourth photosensitive cells. The dispersing element array further includes second and third dispersing elements. The second dispersing element is arranged to face the second photosensitive cell. The second dispersing element makes a part of the light rays falling within the second wavelength range that are included in the second photosensitive cell's entering light incident on its associated first photosensitive cell, makes another part of light rays falling within the second wavelength range that are included in the second photosensitive cell's entering light incident on the first photosensitive cell of another adjacent unit block, and makes light rays falling within the first and third wavelength ranges incident on its associated second photosensitive cell. The third dispersing element is arranged to face the third photosensitive cell. The third dispersing element makes light rays falling within one of the first and second wavelength ranges that are included in the third photosensitive cell's entering light incident on its associated fourth photosensitive cell, makes light rays falling within the other one of the first and second wavelength ranges that are included in the third photosensitive cell's entering light incident on the fourth photosensitive cell of the adjacent unit block, and makes the light ray falling within the third wavelength range incident on its associated third photosensitive cell. The color filter array includes a second color filter that is arranged between the second photosensitive cell and the second dispersing element, and that either absorbs or reflects the light ray falling within the second wavelength range.

In this particular preferred embodiment, the color filter array includes a third color filter that is arranged between the third photosensitive cell and the third dispersing element, and that either absorbs or reflects the light rays respectively falling within the first and second wavelength ranges.

In another preferred embodiment, each unit block further includes third and fourth photosensitive cells. The dispersing element array further includes a second dispersing element. The second dispersing element is arranged to face the second photosensitive cell. The second dispersing element makes a part of the light rays falling within the second wavelength range that are included in the second photosensitive cell's entering light incident on its associated first photosensitive cell, makes another part of the light rays falling within the second wavelength range that are included in the second photosensitive cell's entering light incident on the first photosensitive cell of another adjacent unit block, and makes light rays falling within the first and third wavelength ranges incident on its associated second photosensitive cell. The color filter array includes a second color filter that is arranged between the second photosensitive cell and the second dispersing element, and that either absorbs or reflects the light ray falling within the second wavelength range. The color filter array includes a third color filter that is arranged between the third photosensitive cell and the third dispersing element, and that either absorbs or reflects the light rays that respectively fall within the first and second wavelength ranges.

In still another preferred embodiment, the first wavelength range belongs to one of red and blue ranges, the second wavelength range belongs to the other of the red and blue ranges, and the third wavelength range belongs to a green range.

In yet another preferred embodiment, each of the dispersing elements of the dispersing element array has a light-transmitting member, and disperses the incoming light by using a difference in refractive index between that light-transmitting member and another light-transmitting member that has a lower refractive index than the former light-transmitting member.

An image capture device according to the present invention includes: a solid-state image sensor according to any of the preferred embodiments of the present invention described above; an optical system that forms an image on the solid-state image sensor; and a signal processing section, that processes signals supplied from the solid-state image sensor and generates color information.

Advantageous Effects of Invention

In a solid-state image sensor according to the present invention, a dispersing element that disperses incoming light according to the wavelength range is arranged on its imaging area, and a color filter that either absorbs or reflects a light ray falling within some wavelength range is arranged between the pixels and the dispersing element. If the color filter is designed so as to have an ideal dispersing property according to the property of the dispersing element, the photoelectrically converted signal to be supplied from a pixel that receives the light that has been transmitted through that color filter can be even closer to an ideal one. In other words, even if the dispersing property of the dispersing element is slightly different from the designed one, a signal variation to be caused due to that slight difference can be compensated for by the color filter. Consequently, the image sensor of the present invention can capture an image with a higher degree of color reproducibility than a situation where a conventional image sensor is used. According to the present invention, even though the incoming light is partially lost by the color filter, that loss results from the slight difference of the dispersing property of the dispersing element from the designed one, and therefore, is very little. That is why the present invention provides an image capture device that achieves a high degree of color reproducibility and optical efficiency.

DESCRIPTION OF EMBODIMENTS

Figure 1:
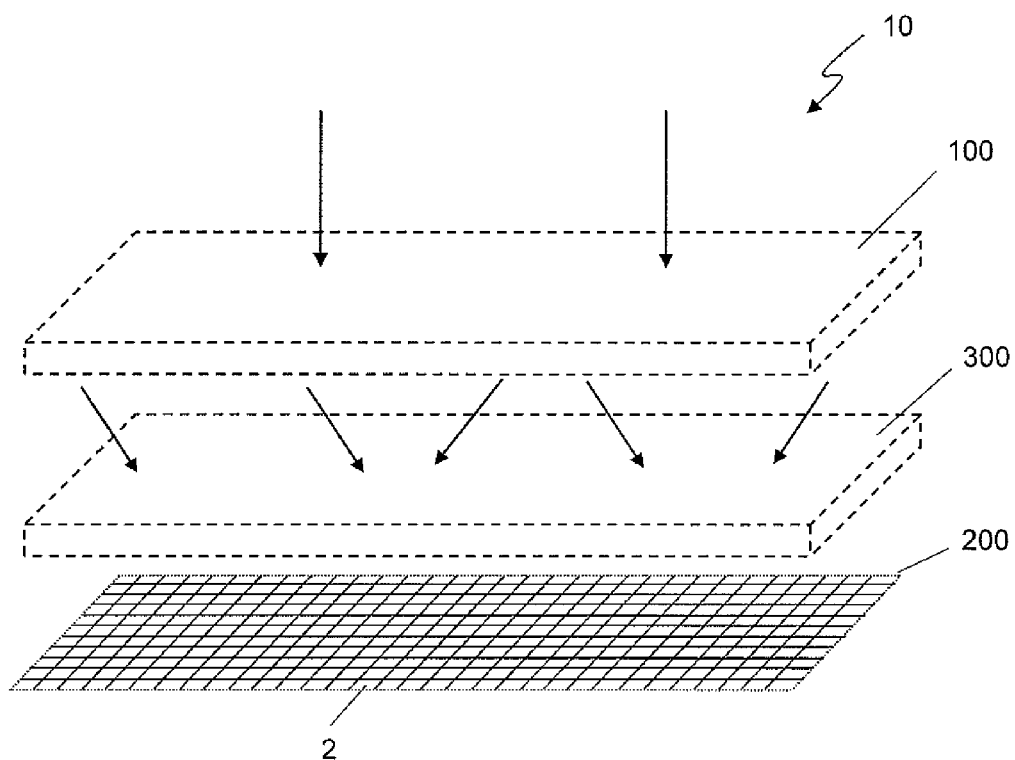
FIG. 1 is a perspective view illustrating a relative arrangement of a photosensitive cell array, a dispersing element array and a color filter array in a solid-state image sensor according to the present invention.

First of all, the fundamental principle of the present invention will be described with reference to FIGS. 1 to 5 before its preferred embodiments are described. In the following description, any pair of components shown in multiple drawings and having substantially the same function will be identified by the same reference numeral. Also, in the following description, to spatially disperse incident light into multiple components of light falling within mutually different wavelength ranges will be referred to herein as "dispersing of light".

A solid-state image sensor according to the present invention includes a photosensitive cell array in which photosensitive cells (pixels) are arranged two-dimensionally on an imaging area, a dispersing element array including a number of dispersing elements, and a color filter array including a plurality of color filters. FIG. 1 is a perspective view illustrating respective portions of a photosensitive cell array 200, a dispersing element array 100 and a color filter array 300, which are stacked on the imaging area of a solid-state image sensor 10. The dispersing element array 100 is arranged so as to face the photosensitive cell array 200 and to receive the incoming light (i.e., only on the light incident side of the device), and includes a number of dispersing elements, each of which spatially disperses incoming light according to the wavelength range. The color filter array 300 is arranged between the photosensitive cell array 200 and the dispersing element array 100 and includes a number of color filters, each of which either absorbs or reflects a part of the light ray that has come from the dispersing element array 100. It should be noted that the photosensitive cells 2 do not have to have such an arrangement, shape or size as the one shown in FIG. 1 but may also have any other known arrangement, shape or size. Also, the dispersing element array 100 and the color filter array 300 are illustrated in FIG. 1 as a quadrangular prism for convenience sake but actually do not always have such a shape but may have any other structure as well. On receiving incoming light, each photosensitive cell 2 performs photoelectric conversion on the light and outputs an electrical signal representing the intensity (or the quantity) of the light received (or the quantity of the light received). Such an electrical signal will be referred to herein as a "photoelectrically converted signal" or a "pixel signal".

Hereinafter, the basic structure of the image sensor 10 of the present invention will be described with reference to FIGS. 2A and 2B.

Figure 2A:
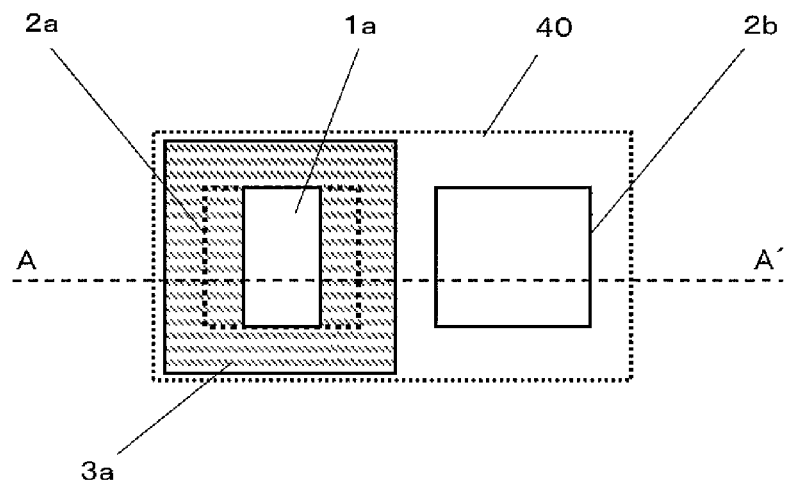
FIG. 2A is a plan view illustrating an exemplary basic structure for a solid-state image sensor according to the present invention.

FIG. 2A is a plan view illustrating an exemplary basic pixel structure (which will be referred to herein as a "unit block") 40 of the photosensitive cell array 200 that is arranged on the imaging area. The photosensitive cell array 200 has a structure in which a number of unit blocks 40, each including two photosensitive cells 2a and 2b, are arranged two-dimensionally on the imaging area. In addition, a color filter 3a is arranged on the light incident side so as to face the first photosensitive cell 2a. A dispersing element 1a is arranged on the light incident side so as to face that color filter 3a. In this example, no color filter or dispersing element is provided to face the second photosensitive cell 2b.

Figure 2B:
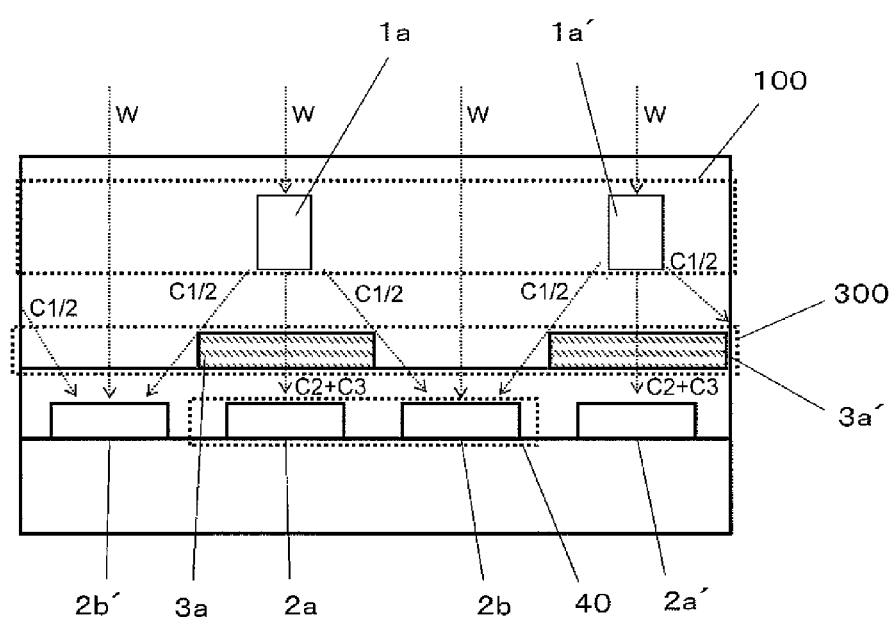
FIG. 2B is a cross-sectional view thereof as viewed on the plane AA' shown in FIG. 2A.

FIG. 2B is a cross-sectional view of the image sensor as viewed on the plane A-A' shown in FIG. 2A. In FIG. 2B, also illustrated are the first photosensitive cell 2b' of an adjacent unit block (which will be referred to herein as a "first adjacent unit block") and a color filter 3a' and a dispersing element 1a' that face the first photosensitive cell 2a' of another adjacent unit block (which will be referred to herein as a "second adjacent unit block"). The dispersing element 1a' and the color filter 3a' have the same structure as the dispersing element 1a and the color filter 3a, respectively. As can be seen, a number of unit blocks, each including the photosensitive cells 2a and 2b, the color filter 3a and the dispersing element 1a, are arranged on the imaging area so as to form a repetitive pattern there. As shown in FIG. 2B, the incoming light W is dispersed by the dispersing element 1a according to the wavelength range into multiple light rays falling within multiple different wavelength ranges, which are then incident on the photosensitive cells 2a and 2b. Specifically, the dispersing element 1a is arranged so as to make one and the other halves (C1/2) of a light ray falling within the first wavelength range (C1), which is included in the light that has entered the dispersing element 1a, incident on the photosensitive cell 2b and the photosensitive cell 2b' of the first adjacent unit block, respectively, and also make light rays falling within second and third wavelength ranges (C2+C3) incident on the photosensitive cell 2a. The color filter 3a has such a property as to either absorb or reflect the light ray falling within the first wavelength range (C1) but transmit the light rays falling within the second and third wavelength ranges (C2+C3).

In this description, the light that would be directly received by each photosensitive cell were it not for the dispersing element array 100 and the color filter array 300 will be referred to herein as "cell's entering light". If the photosensitive cells 2a and 2b included in each single unit block are located close to each other, then those photosensitive cells' entering light should have almost the same light intensity distribution and substantially the same spectral distribution (i.e., distribution of intensities associated with respective wavelength ranges). The intensity of the visible radiation component of each of those photosensitive cells' entering light will be identified herein by the sign "W". Also, the cell's entering light will sometimes be referred to herein as "W light". In this description, the visible radiation component included in the cell's entering light will be roughly classified into first, second and third color components. Also, the three different wavelength ranges associated with the first, second and third color components will be referred to herein as first, second and third wavelength ranges, respectively. That is to say, if the intensities of the light rays falling within the first, second and third wavelength range are identified by C1, C2 and C3, respectively, then W=C1+C2+C3. A typical combination of the first, second and third wavelength ranges consists of the wavelength ranges belonging to the three primary colors of red (R), green (G) and blue (B). However, as long as the wavelength range of visible radiation can be divided into three wavelength ranges, any other combination of wavelength ranges may be adopted as well. In the following description, light rays falling within the first, second and third wavelength ranges will sometimes be referred to herein as C1, C2 and C3 rays, respectively.

In the arrangement illustrated in FIG. 2B, the photosensitive cell 2a receives C2 and C3 rays falling within the second and third wavelength ranges through the dispersing element 1a that faces itself. On the other hand, the photosensitive cell 2b receives not only C1 rays, each having an intensity C1/2, through the dispersing elements 1a and 1a' that face the two adjacent photosensitive cells 2a and 2a' thereof, but also directly incoming light W that has not passed through any dispersing element. Consequently, the photoelectrically converted signals S2a and S2b supplied from the photosensitive cells 2a and 2b can be calculated by the following Equations (1) and (2) and signals representing the intensities of the W light and the C1, C2 and C3 rays will be identified herein by Ws, C1s, C2s and C3s, respectively.

$$S2a = Ws - C1s = C2s + C3s \quad (1)$$

$$S2b = Ws + C1s = 2C1s + C2s + C3s \quad (2)$$

If S2a is subtracted from S2b, the following Equation (3) is satisfied:

$$S2b - S2a = 2C1 \quad (3)$$

Equation (3) indicates that the difference between the two photoelectrically converted signals S2a and S2b is twice as large as the signal C1s representing the intensity of the light ray falling within the first wavelength range. As can be seen, with the arrangement shown in FIGS. 2A and 2B, information about the intensity C1 of the light ray falling within the first wavelength range can be obtained on a unit block (40) basis. As a result, an image representing the first color component (e.g., the color red) can be obtained.

A key feature of the present invention is that the color filter 3a that either absorbs or reflects the light ray falling within the first wavelength range is arranged between the photosensitive cell 2a and the dispersing element 1a. With such an arrangement adopted, even if the dispersing performance of the dispersing element 1a is slightly inferior to the ideal one, the light ray falling within the first wavelength range will never be incident on the photosensitive cell 2a. That is to say, as it is possible to prevent the component of the C1 ray and the signal S2a represented by Equation (1) from getting mixed up, the color reproducibility can be increased eventually compared to the prior art.

In the arrangement illustrated in FIG. 2B, the dispersing element 1a makes one and the other halves of the light ray falling within the first wavelength range incident on the two adjacent photosensitive cells 2b and 2b', respectively, which are arranged on the right- and left-hand sides of the photosensitive cell 2a that faces the dispersing element 1a. However, parts of the C1 ray may be incident on those two photosensitive cells 2b and 2b' at any other ratio. The dispersing element 1a may make parts of the C1 ray of the W light incident on the photosensitive cells 2b and 2b' at a ratio of seven to three, for example. In that case, the photosensitive cell 2b receives a part of the C1 ray (represented as 0.7 C1) from the dispersing element 1a and the rest of the C1 ray (represented as 0.3 C1) from the dispersing element 1a'. As a result, the total quantity of the C1 ray received by the photosensitive cell 2b is no different from a situation where the arrangement shown in FIG. 2B is adopted.

Figure 3A:
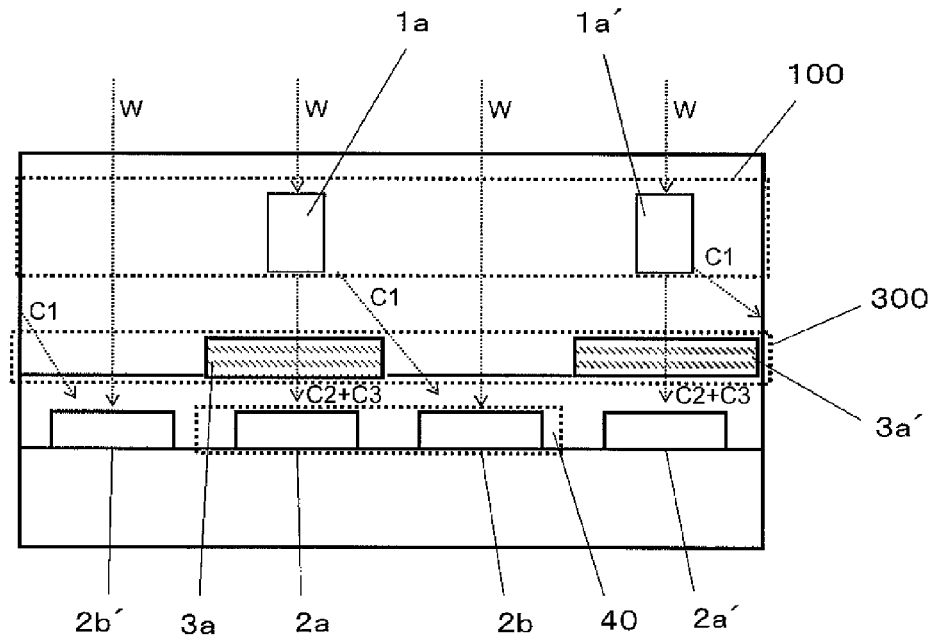
FIG. 3A illustrates the cross-sectional structure of another solid-state image sensor according to the present invention.

Alternatively, the dispersing element 1a may also be arranged to make almost all of the light ray falling within the first wavelength range incident on the photosensitive cell 2b but make no light rays incident on the photosensitive cell 2b' as shown in FIG. 3A. Even when such an arrangement is adopted, an image representing the first color component can also be obtained in quite the same way as described above by performing the signal arithmetic operations represented by Equations (1) to (3). Likewise, the color filter 3a can also prevent the C1 light from entering the photosensitive cell 2a as described above.

Figure 3B:
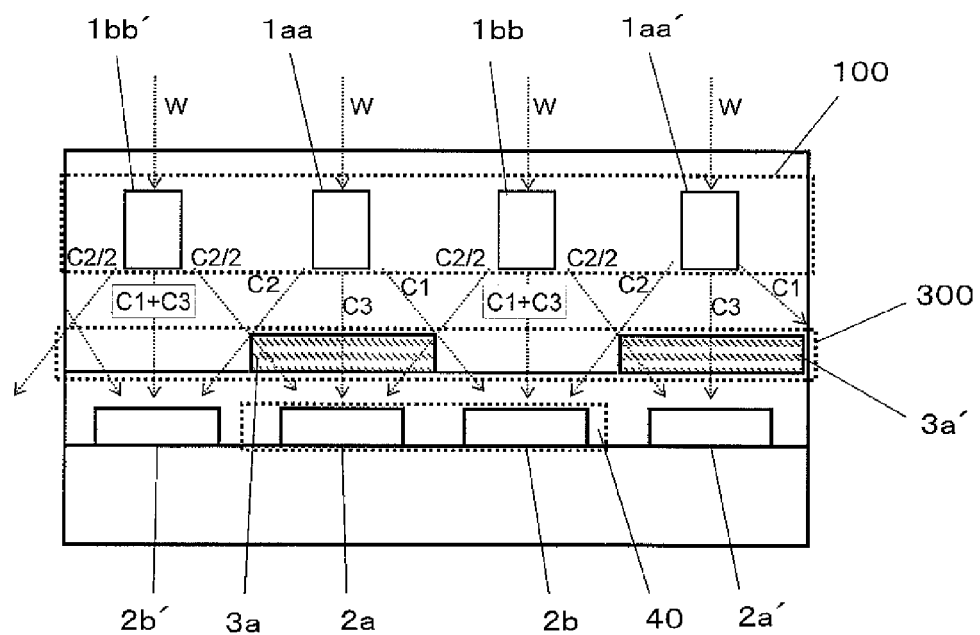
FIG. 3B illustrates the cross-sectional structure of still another solid-state image sensor according to the present invention.

Still alternatively, the arrangement shown in FIG. 3B may also be adopted. In this arrangement, dispersing elements 1aa and 1bb, having a different dispersing property from the dispersing element 1a described above, are arranged to face the first and second photosensitive cells 2a and 2b, respectively. The dispersing element 1aa makes C1, C2 and C3 rays that respectively fall within the first, second and third wavelength ranges incident on its associated second photosensitive cell 2b, a photosensitive cell 2b' of a first adjacent unit block, and its associated first photosensitive cell 2a, respectively. On the other hand, the dispersing element 1bb makes one and the other halves of the C2 ray falling within the second wavelength range incident on its associated first photosensitive cell 2a and on a photosensitive cell 2a' of a second adjacent unit block, respectively, and also makes the sum of the C1 and C3 rays (C1+C3) incident on its associated second photosensitive cell 2b. In this exemplary arrangement, the color filter 3a is also arranged to face the photosensitive cell 2a and also has such a property as to absorb or reflect only the C1 ray. Even when such an arrangement is adopted, the signal arithmetic processing represented by Equations (1) to (3) is also performed just as described above. Likewise, the color filter 3a can also prevent the C1 light from entering the photosensitive cell 2a as described above.

As described above, to obtain a signal representing one color component based on the photoelectrically converted signals of two photosensitive cells, the respective members may be arranged so that a differential signal of the two photosensitive cells is proportional to a signal representing the intensity of a light ray with that color component. As long as such an arrangement is adopted, an image representing one color component can also be obtained not just in the example described above. In the examples described above, the C1 ray represents one color component of visible radiation. However, the C1 ray does not have to belong to visible radiation but may also belong to an infrared ray or an ultraviolet ray. That is to say, the present invention can also be used to generate an infrared image or an ultraviolet image as well.

According to the present invention, not just an image representing one color component but also an image representing three color components (i.e., a color image) can be obtained as well. In order to obtain a color image, each unit block needs to include three or more photosensitive cells and the dispersing element array needs to be arranged so that light rays with different spectral distributions are incident on the respective photosensitive cells. In this description, if two light rays "have different spectral distributions", then it means that those two light rays have mutually different major color components. For example, if the first photosensitive cell receives C1 and C2 rays as major light rays and if the second photosensitive cell receives C2 and C3 rays as major light rays, then the two sets of light rays received by them have mutually different spectral distributions.

Figure 4:
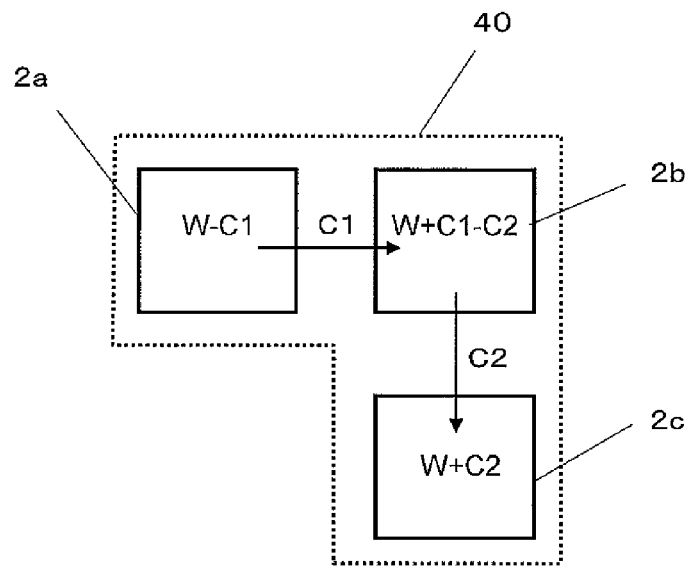
FIG. 4 is a plan view illustrating an exemplary basic structure for a solid-state image sensor that uses three pixels as a unit.

FIG. 4 is a plan view illustrating an exemplary arrangement that can obtain a color image. In this example, each unit block 40 includes three photosensitive cells 2a, 2b and 2c. First and second dispersing elements (not shown) are arranged to face the first and second photosensitive cells 2a and 2b, respectively. The first dispersing element is arranged so as to make the C1 ray incident on the second photosensitive cell 2b and the other non-C1 rays incident on the first photosensitive cell 2a, respectively. On the other hand, the second dispersing element is arranged so as to make the C2 ray incident on the third photosensitive cell 2c and the other non-C2 rays incident on the second photosensitive cell 2b, respectively. A first color filter (not shown) that either absorbs or reflects the C1 ray is arranged between the first photosensitive cell 2a and the first dispersing element. And a second color filter (not shown, either) that either absorbs or reflects the C2 ray is arranged between the second photosensitive cell 2b and the second dispersing element.

Consequently, the photoelectrically converted signals S2a, S2b and S2c supplied from the photosensitive cells 2a, 2b and 2c can be calculated by the following Equations (4), (5) and (6), respectively:

$$S2a = Ws - C1s = C2s + C3s \quad (4)$$

$$S2b = Ws + C1s - C2s = 2C1s + C3s \quad (5)$$

$$S2c = Ws + C2s = C1s + 2C2s + C3s \quad (6)$$

Based on these photoelectrically converted signals, three color signals C1s, C2s and C3s are obtained in the following manner. First of all, by adding S2a, S2b and S2c together, a signal 3Ws is obtained. Next, by calculating Ws−S2a, the signal C1s is obtained. Then, by calculating S2b−2C1s using the signal C1s thus obtained, the signal C3s is obtained. Finally, by calculating S2c−C1s−C3s, 2C2s can be obtained. By performing this series of arithmetic processing on each single unit block, the three color signals C1s, C2s and C3s can be obtained on a unit block basis. As a result, a color image can be generated.

In the exemplary arrangement shown in FIG. 4, a color filter that does not transmit the C1 ray is arranged to face the photosensitive cell 2a and a color filter that does not transmit the C2 ray is arranged to face the photosensitive cell 2b. That is why even if the dispersing properties of the first and second dispersing elements are slightly different from the ideal one, it is also possible to prevent the C1 and C2 rays from entering the photosensitive cells $2a$ and $2b$, respectively, unintentionally. As a result, a color image capture device with a high degree of color reproducibility is realized. It should be noted that in order to generate a color image, not just the arrangement described above but also any other arrangement may be adopted as well as long as the photoelectrically converted signals of at least three photosensitive cells included in each single unit block are different from each other.

In the exemplary arrangement described above, the dispersing element array 100 is arranged so that at least two of the C1, C2 and C3 rays, which have been dispersed from each other, are incident as superposed light rays on each photosensitive cell. According to the present invention, each unit block may be designed so that some photosensitive cell receives a single color ray. Nevertheless, the dispersing element array is designed so that at least two of the C1, C2 and C3 rays are incident as superposed light rays on at least one photosensitive cell.

Figure 5:
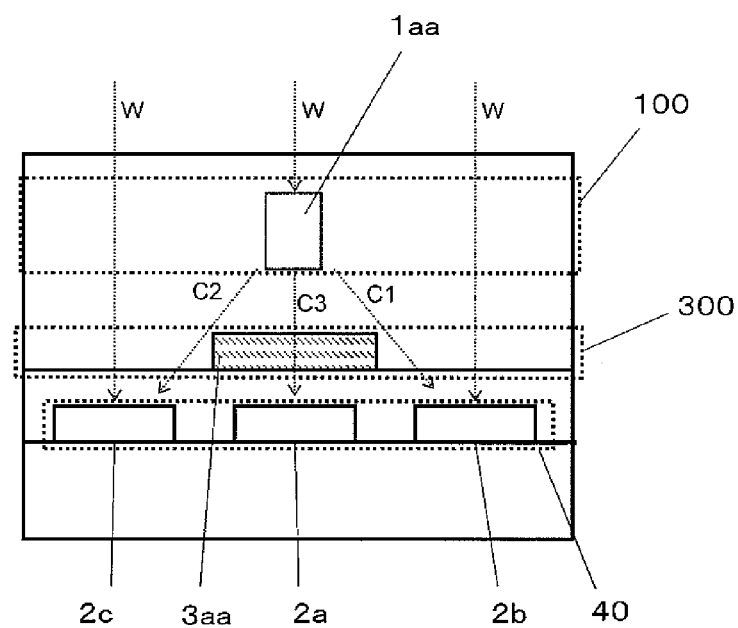
FIG. 5 illustrates the cross-sectional structure of another solid-state image sensor that uses three pixels as a unit.

FIG. 5 illustrates an exemplary cross-sectional structure of an image sensor 10 that is designed so that a single color ray is incident on some photosensitive cell. In this example, each unit block 40 includes three photosensitive cells $2a$, $2b$ and $2c$. A dispersing element $1aa$ is arranged to face the first photosensitive cell $2a$. The dispersing element $1aa$ is arranged so as to make the C1, C2 and C3 rays incident on the second, third and first photosensitive cells $2b$, $2c$ and $2a$, respectively. A color filter $3aa$ that transmits only the C3 ray and either absorbs or reflects the other rays is arranged between the first photosensitive cell $2a$ and the dispersing element $1aa$. Even when such an arrangement is adopted, it is also possible to prevent unexpected light rays (i.e., the C1 and C2 rays) from entering the photosensitive cell $2a$ due to a manufacturing error, for example. In this arrangement, the photoelectrically converted signals S2a, S2b and S2c of the photosensitive cells $2a$, $2b$ and $2c$ are represented by the following Equations (7) to (9), respectively:

$$S2a = C3s \tag{7}$$

$$S2b = Ws + C1s = 2C1s + C2s + C3s \tag{8}$$

$$S2c = Ws + C2s = C1s + 2C2s + C3s \tag{9}$$

By these Equations (7) to (9), signals C1s, C2s and C3s representing the intensities of the three color components can be obtained. Consequently, even when the arrangement shown in FIG. 5 is adopted, a color image can also be generated.

As described above, in the image sensor 10 of the present invention, a color filter that either absorbs or reflects a light ray falling within at least one wavelength range is arranged to face a photosensitive cell that is arranged so as not to receive that light ray. As a result, it is possible to prevent a light ray falling within an unexpected wavelength range from entering that photosensitive cell. Also, the dispersing element array 100 of the present invention is designed so that at least two of three light rays falling within first, second and third wavelength ranges are superposed one upon the other and incident on at least one photosensitive cell included in each unit block 40. The dispersing element that is arranged to face the first photosensitive cell $2a$ included in each unit block 40 makes at least a part of the light ray falling within the first wavelength range incident on the second photosensitive cell $2b$. With such an arrangement adopted, color information can be generated based on the photoelectrically converted signals of the first and second photosensitive cells $2a$ and $2b$.

In FIGS. 2A through 3B and FIG. 5, each dispersing element is illustrated as a rectangular element. However, the dispersing element does not always have to have such a shape. As a dispersing element according to the present invention, a high-refractive-index transparent member, a multilayer filter (dichroic mirror) or a micro prism may also be used as will be described later. Also, as the color filter, not just a known color filter of light absorbing type but also a dichroic mirror that transmits only a light ray falling within a particular wavelength range but reflects a light ray falling within any other wavelength range can be used as well.

Hereinafter, preferred embodiments of the present invention will be described with reference to FIGS. 6 through 12C.

Embodiment 1

Figure 6:
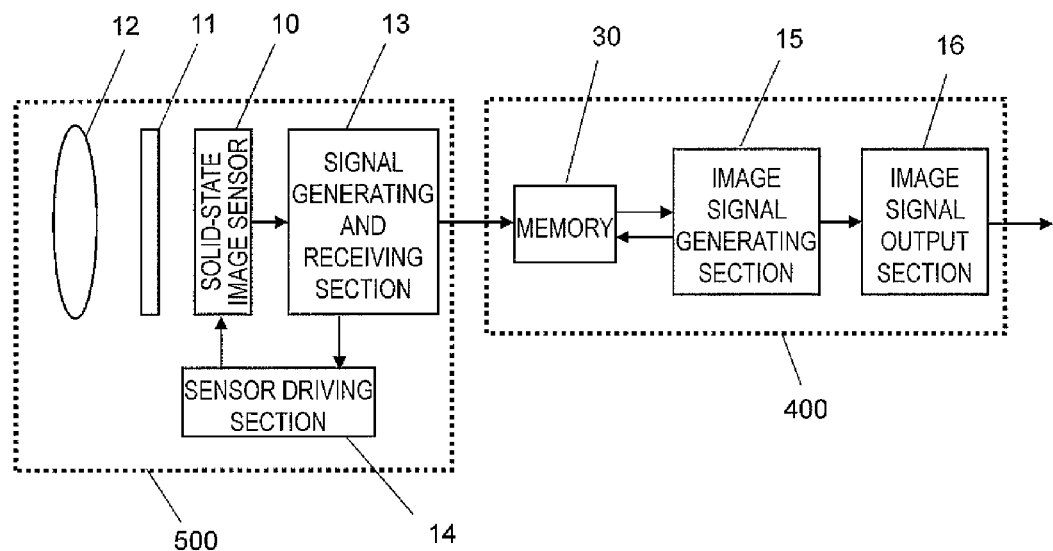
FIG. 6 is a block diagram illustrating a general configuration for an image capture device as a first preferred embodiment of the present invention.

FIG. 6 is a block diagram illustrating an overall configuration for an image capture device as a first preferred embodiment of the present invention. The image capture device of this preferred embodiment is a digital electronic camera and includes an image capturing section 500 and a signal processing section 400 that receives a signal from the image capturing section 500 and outputs a signal representing an image (i.e., an image signal). The image capture device may either generate only a still picture or have the function of generating a moving picture.

The image capturing section 500 includes an optical lens 12 for imaging a given subject, an optical filter 11, a solid-state image sensor 10 (which will be simply referred to herein as an "image sensor") for converting the optical information that has been gotten through the optical lens 12 and the optical filter 11 into an electrical signal by photoelectric conversion. The image capturing section 500 further includes a signal generating and receiving section 13, which not only generates a fundamental signal to drive the image sensor 10 but also receives the output signal of the image sensor 10 and sends it to the signal processing section 400 and a sensor driving section 14 for driving the image sensor 10 in accordance with the fundamental signal generated by the signal generating and receiving section 13. The optical lens 12 is a known lens and may be a lens unit including multiple lenses. The optical filters 11 are a combination of a quartz crystal low-pass filter for reducing a moiré pattern to be caused by a pixel arrangement with an infrared cut filter for filtering out infrared rays. The image sensor 10 is typically a CMOS or a CCD, and may be fabricated by known semiconductor device processing technologies. The signal generating and receiving section 13 and the sensor driving section 14 may be implemented as an LSI such as a CCD driver.

The signal processing section 400 includes an image signal generating section 15 for generating an image signal by processing the signal supplied from the image capturing section 500, a memory 30 for storing various kinds of data that have been produced while the image signal is being generated, and an image signal output section 16 for sending out the image signal thus generated to an external device. The image signal generating section 15 is preferably a combination of a hardware component such as a known digital signal processor (DSP) and a software program for use to perform image processing involving the image signal generation. The memory 30 may be a DRAM, for example. And the memory 30 not only stores the signal supplied from the image capturing section 500 but also temporarily retains the image data that has been generated by the image signal generating section 15 or compressed image data. These image data are then output to either a storage medium or a display section (neither is shown) by way of the image signal output section 16.

The image capture device of this preferred embodiment actually further includes an electronic shutter, a viewfinder, a power supply (or battery), a flashlight and other known components. However, the description thereof will be omitted herein because none of them are essential components that would make it difficult to understand how the present invention works unless they were described in detail. It should also be noted that this configuration is just an example. Rather, the present invention may also be carried out as any other appropriate combination of known elements except the image sensor 10.

Hereinafter, the solid-state image sensor 10 of this preferred embodiment will be described in further detail.

Figure 7:
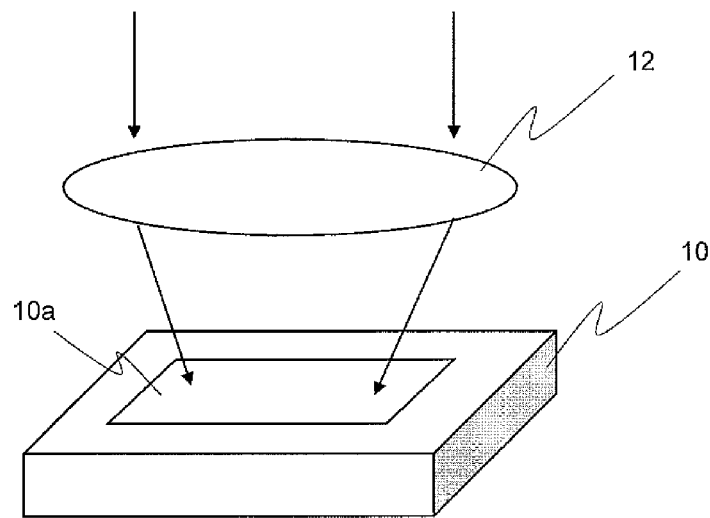
FIG. 7 illustrates how a lens and an image sensor may be arranged according to the first preferred embodiment of the present invention.

FIG. 7 schematically illustrates how the light that has been transmitted through the lens 12 is incident on the image sensor 10 during an exposure. In FIG. 7, shown are only the optical lens 12 and the image sensor 10 with illustration of the other components omitted for the sake of simplicity. Also, although the lens 12 actually often consists of a number of lenses that are arranged in the optical axis direction, the lens 12 shown in FIG. 7 is illustrated as a single lens in a simplified form. On the imaging area 10a of the image sensor 10, arranged two-dimensionally are a number of photosensitive cells (pixels) that form a photosensitive cell array. Those photosensitive cells are typically photodiodes, each of which outputs, as a pixel signal, a photoelectrically converted signal representing the intensity of the light received (which will be referred to herein as an "incident light intensity"). The light (visible radiation) that has been transmitted through the lens 12 and the optical filter 11 is incident on the imaging area 10a. Generally speaking, the intensity of the light impinging on the imaging area 10a and the distribution of the quantities of incoming light rays that fall within multiple different wavelength ranges (which will be referred to herein as a "spectral distribution") vary from one point of incidence to another.

Figure 8A:
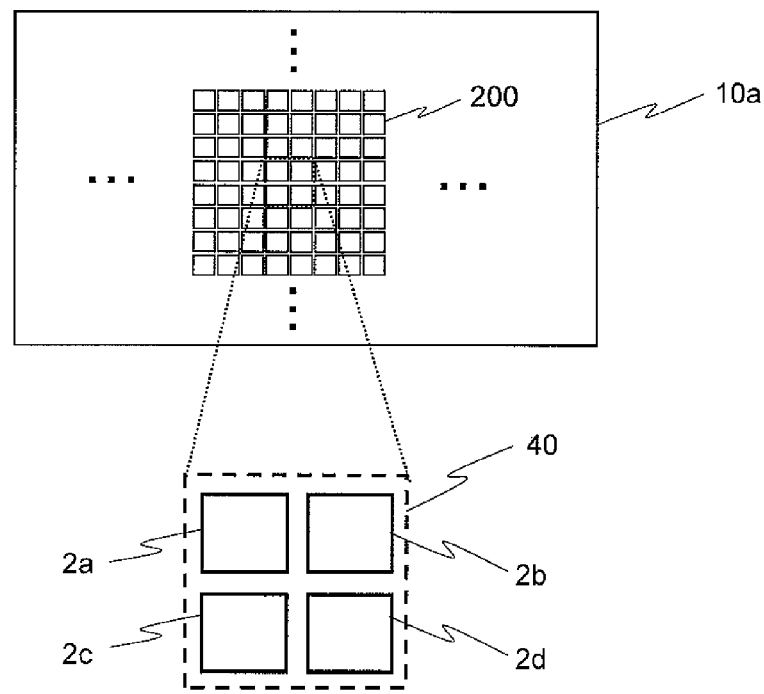
FIG. 8A is a plan view illustrating an example of a unit pixel block of the solid-state image sensor according to the first preferred embodiment of the present invention.
Figure 8B:
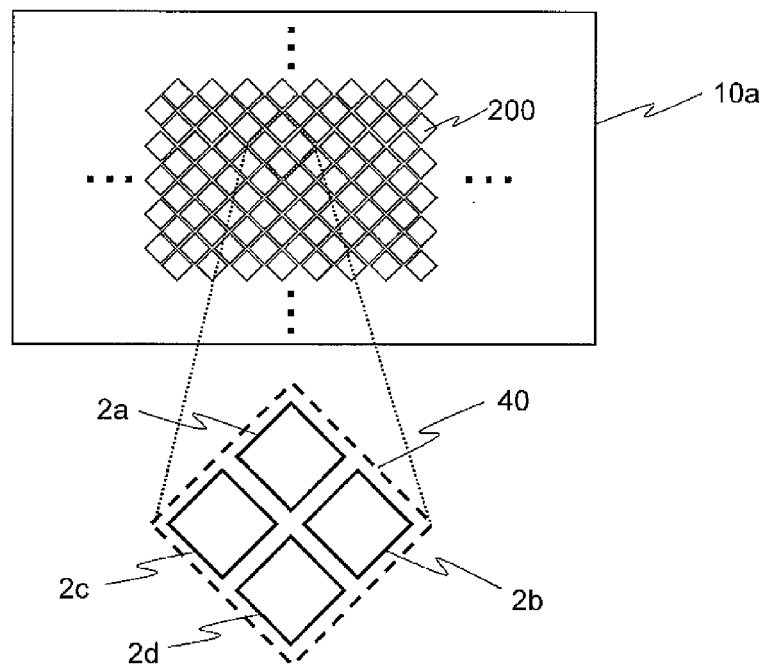
FIG. 8B is a plan view illustrating another example of a unit pixel block of the solid-state image sensor according to the first preferred embodiment of the present invention.

FIGS. 8A and 8B are plan views illustrating arrangements of pixels according to a preferred embodiment of the present invention. As shown in FIG. 8A, the photosensitive cell array 200 may be made up of a number of photosensitive cells that are arranged on the imaging area 10a to form a tetragonal lattice. The photosensitive cell array 200 is divided into a number of unit blocks 40, each of which consists of four photosensitive cells 2a, 2b, 2c and 2d. Optionally, in an alternative preferred embodiment of the present invention, the photosensitive cells may also have an oblique lattice arrangement as shown in FIG. 8B, instead of the tetragonal lattice arrangement shown in FIG. 8A, or any other appropriate arrangement. Furthermore, it is preferred that the four photosensitive cells 2a to 2d included in each unit block be arranged close to each other as shown in FIGS. 8A and 8B. However, even if those photosensitive cells 2a to 2d were well spaced from each other, color information could still be obtained by forming appropriately the dispersing element array.

The dispersing element array 100 consisting of multiple dispersing elements is arranged on the light incident side so as to face the photosensitive cell array 200. According to this preferred embodiment, four dispersing elements are arranged so as to face one to one the four photosensitive cells that are included in each unit block 40. And a color filter is further arranged between each of two out of those four photosensitive cells and the dispersing element that faces it.

Hereinafter, the dispersing elements of this preferred embodiment will be described.

The dispersing element of this preferred embodiment is an optical element for refracting incoming light to multiple different directions according to the wavelength range by utilizing diffraction of the light to produce on the boundary between two different light-transmitting members with mutually different refractive indices. The dispersing element of that type includes high-refractive-index transparent portions (core portions), which are made of a material with a relatively high refractive index, and low-refractive-index transparent portions (clad portions), which are made of a material with a relatively low refractive index and which contact with side surfaces of the core portions. Since the core portion and the clad portion have mutually different refractive indices, a phase difference is caused between the light rays that have been transmitted through the core and clad portions, thus producing diffraction. And since the magnitude of the phase difference varies according to the wavelength of the light, the incoming light can be spatially dispersed according to the wavelength range into multiple light rays with respective color components. For example, one and the other halves of a light ray with a first color component can be refracted toward first and second directions, respectively, and a light ray with a color component other than the first color component can be refracted toward a third direction. Alternatively, three light rays with mutually different color components could be refracted toward three different directions, too. Since the incoming light can be dispersed due to the difference in refractive index between the core and clad portions, the high-refractive-index transparent portion will sometimes be referred to herein as a "dispersing element". It should be noted that if "light that has entered a dispersing element" is mentioned in this description, then that light includes not only light that has impinged on the high-refractive-index transparent member but also light that has impinged on the low-refractive-index transparent member that surrounds the high-refractive-index transparent member as well. Such diffractive dispersing elements are disclosed in Japanese Patent Publication No. 4264465, for example.

A dispersing element array, including such dispersing elements, may be fabricated by performing thin-film deposition and patterning processes by known semiconductor device processing technologies. By appropriately determining the material (and refractive index), shape, size and arrangement pattern of the dispersing elements, multiple light rays falling within intended wavelength ranges can be made to be incident on respective photosensitive cells either separately from each other or combined together. As a result, signals representing required color components can be calculated based on a set of photoelectrically converted signals supplied from the respective photosensitive cells.

Hereinafter, it will be described with reference to FIGS. 9A through 9C what the basic structure of the image sensor 10 of this preferred embodiment is like.

Figure 9A:
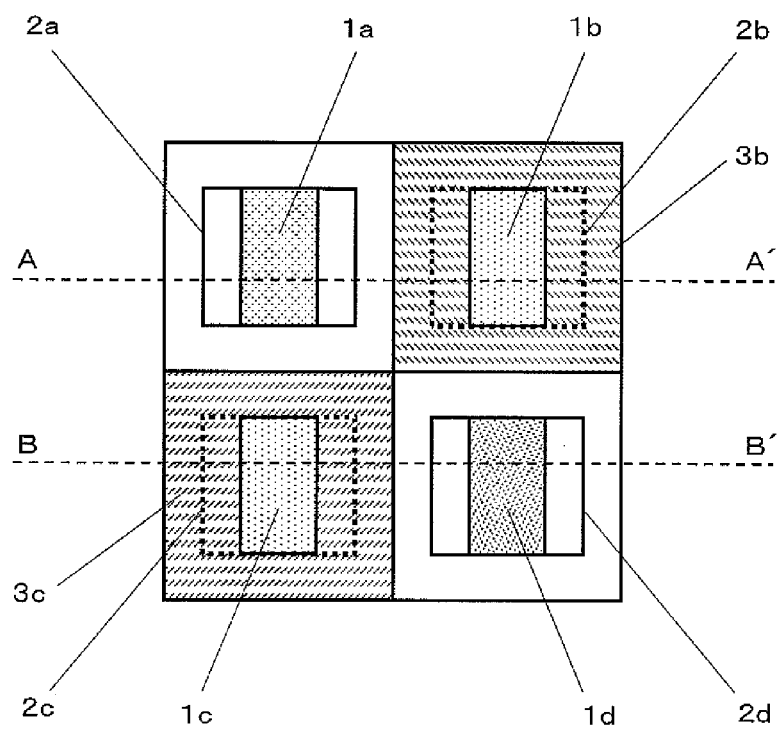
FIG. 9A is a plan view illustrating an exemplary basic structure for an image sensor according to the first preferred embodiment of the present invention.

FIG. 9A is a plan view illustrating the basic structure of the image sensor 10 of this preferred embodiment. In each unit block 40, four dispersing elements 1a, 1b, 1c and 1d are arranged so as to face the four photosensitive cells 2a, 2b, 2c and 2d, respectively. A color filter (Cy filter) 3b, which absorbs a light ray falling within the red wavelength range but transmits light rays falling within the green and blue wavelength ranges, respectively, is arranged between the photosensitive cell 2b at the row 1, column 2 position and the dispersing element 1b. And a color filter (Ye filter) 3c, which absorbs a light ray falling within the blue wavelength range but transmits light rays falling within the red and green wavelength ranges, is arranged between the photosensitive cell 2c at the row 2, column 1 position and the dispersing element 1c. A number of basic structures, each having the same arrangement pattern like this, are arranged over the entire imaging area 10a.

Figure 9B:
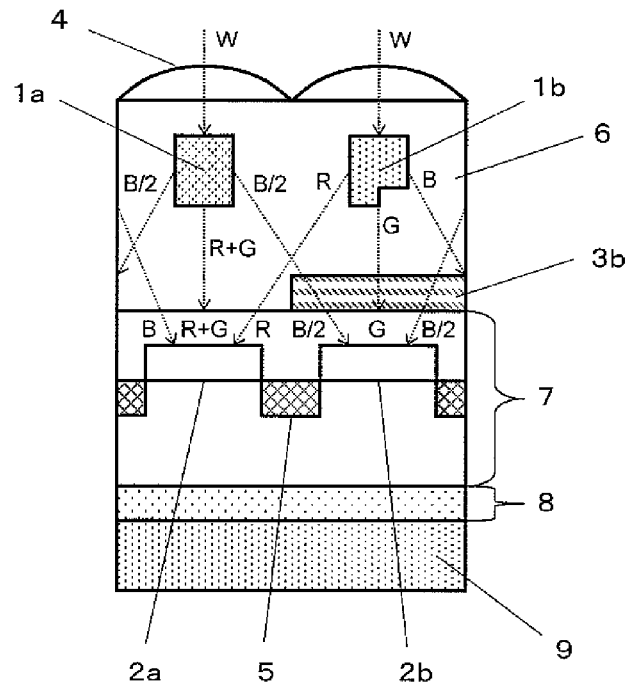
FIG. 9B is a cross-sectional view thereof as viewed on the plane AA' shown in FIG. 9A.
Figure 9C:
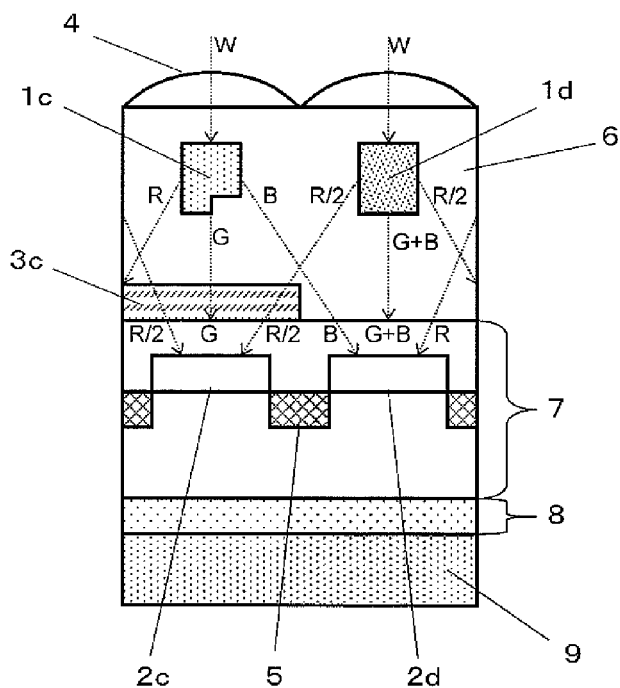
FIG. 9C is a cross-sectional view thereof as viewed on the plane BB' shown in FIG. 9A.

FIGS. 9B and 9C are cross-sectional views of the image sensor 10 shown in FIG. 9A as viewed on the planes A-A' and B-B', respectively. As shown in FIGS. 9B and 9C, the image sensor 10 includes: a semiconductor substrate 7 made of silicon or any other suitable material; photosensitive cells 2a through 2d, which are arranged in the semiconductor substrate 7; an interconnect layer 5; a transparent layer 6, which is arranged on the back surface (i.e., on the light incident side) of the semiconductor substrate 7; a supporting base 9, which is arranged on the principal surface (i.e., opposite to the light incident side) of the semiconductor substrate 7; and an adhesive layer 8, which bonds the supporting base 9 and the semiconductor substrate 7 together. In the transparent layer 6, arranged are dispersing elements 1a, 1b, 1c and 1d, which are made of a transparent material that has a higher refractive index than the transparent layer 6, and color filters 3b and 3c, which are made of a known pigment or any other suitable material. In addition, micro lenses 4 that condense the incoming light toward the photosensitive cells efficiently are also arranged to face the respective photosensitive cells with the transparent layer 6 interposed between them.

The structure shown in FIGS. 9B and 9C can be fabricated by known semiconductor device processing. The image sensor 10 of this preferred embodiment has a backside illumination structure in which light is incident on the other side of the device opposite to the interconnect layer 5. However, the image sensor 10 does not have to have such a backside illumination structure but may also have a surface illumination structure. It should be noted that the effect of this preferred embodiment can be achieved even with the micro lenses 4a omitted.

As shown in FIG. 9B, the dispersing element 1a has a rectangular cross section, which is elongated in the light-transmitting direction, and disperses the incoming light into multiple light rays by taking advantage of a difference in refractive index between itself and the transparent layer 6. Specifically, the dispersing element 1a makes R and G rays, which are included in the incoming light W, incident on the photosensitive cell 2a that faces itself and also makes one and the other halves of a B ray incident on the photosensitive cell 2b and on a photosensitive cell (not shown) of first adjacent unit block, respectively. In FIG. 9B, the sign "B/2" indicates that the quantity of the light ray transmitted is a half as large as that of the B ray included in the incoming light.

The dispersing element 1b has a step at its light-outgoing end. And by taking advantage of a difference in refractive index between itself and the transparent layer 6, the dispersing element 1b disperses the incoming light into diffracted rays of various orders including zero-order, first-order, and minus-first-order ones. As the angle of diffraction of each of these rays varies with the wavelength, the dispersing element 1b can disperse the incoming light into three light rays going in three different directions according to the color component. Specifically, the dispersing element 1b makes a G ray incident on the photosensitive cell 2c that faces itself and also makes R and B rays incident on the photosensitive cell 2a and a photosensitive cell (not shown) of a second adjacent unit block, respectively. It should be noted that the B and R rays may be changed with each other. That is to say, the dispersing element 1b may make the B and R rays incident on the photosensitive cell 2a and on a photosensitive cell of a second adjacent unit block, respectively.

Generally speaking, the property of a dispersing element is determined by its shape, refractive index and other factors. According to this preferred embodiment, the dispersing elements 1a and 1b have their length and thickness determined so as to have the dispersing property described above.

The Cy filter 3b is arranged to face the photosensitive cell 2b and transmits only a light ray falling within the cyan wavelength range (that covers the green and blue wavelength ranges) among multiple light rays that have come from the dispersing elements 1a and 1b and from a dispersing element that faces a photosensitive cell of the second adjacent unit block. As a result, only the G and B rays are incident on the photosensitive cell 2b but the R ray isn't.

Due to the functions of the dispersing elements 1a and 1b and the color filter 3b, the photosensitive cell 2a receives R and G rays from the dispersing element 1a, an R ray from the dispersing element 1b and a B ray from a dispersing element (not shown) that faces a photosensitive cell of the first adjacent unit block, respectively. On the other hand, the photosensitive cell 2b receives a G ray from the dispersing element 1b and also receives one and the other halves of a B ray from the dispersing element 1a and a dispersing element (not shown) that faces a photosensitive cell of the second adjacent unit block, respectively.

On the other hand, the dispersing element 1c has a step at its light-outgoing end as shown in FIG. 9C. And by taking advantage of a difference in refractive index between itself and the transparent layer 6, the dispersing element 1c disperses the incoming light into diffracted rays of various orders including zero-order, first-order, and minus-first-order ones. The dispersing element 1c has the same property as the dispersing element 1b described above. Specifically, the dispersing element 1c makes a G ray incident on the photosensitive cell 2c that faces itself and also makes B and R rays incident on the photosensitive cell 2d and a photosensitive cell (not shown) of the first adjacent unit block, respectively. It should be noted that the B and R rays may also be changed with each other. That is to say, the dispersing element 1c may make the R and B rays incident on the photosensitive cell 2d and on a photosensitive cell of the first adjacent unit block, respectively.

The dispersing element 1d has a rectangular cross section, which is elongated in the light-transmitting direction, and disperses the incoming light into multiple light rays by taking advantage of a difference in refractive index between itself and the transparent layer 6. Specifically, the dispersing element 1d makes B and G rays, which are included in the incoming light W, incident on the photosensitive cell 2d that faces itself and also makes one and the other halves of an R ray incident on the photosensitive cell 2c and on a photosensitive cell (not shown) of the second adjacent unit block, respectively. In FIG. 9C, the sign "R/2" indicates that the quantity of the light ray transmitted is a half as large as that of the R ray included in the incoming light.

The dispersing elements 1c and 1d also have their length and thickness determined so as to have the dispersing property described above.

The color filter 3c is arranged to face the photosensitive cell 2c, receives multiple light rays from the dispersing elements 1c and 1d and from a dispersing element that faces a photosensitive cell of the first adjacent unit block, and transmits only a light ray falling within the yellow wavelength range (that covers the red and green wavelength ranges). As a result, only the R and G rays are incident on the photosensitive cell 2c but the B ray isn't.

Due to the functions of the dispersing elements 1c and 1d and the color filter 3c, the photosensitive cell 2c receives a G ray from the dispersing element 1c, and also receives one and the other halves of an R ray from the dispersing element 1d and a dispersing element (not shown) that faces a photosensitive cell of the first adjacent unit block, respectively. On the other hand, the photosensitive cell 2d receives G and B rays from the dispersing element 1d, a B ray from the dispersing element 1c and an R ray from a dispersing element (not shown) that faces a photosensitive cell of the second adjacent unit block, respectively.

With such an arrangement adopted, the photosensitive cells 2a, 2b, 2c and 2d output photoelectrically converted signals S2a through S2d given by the following Equations (10) through (13), respectively, where signals representing the intensities of R, G and B rays are identified by Rs, Gs and Bs, respectively:

$$S2a = 2Rs + Gs + Bs \quad (10)$$

$$S2b = Gs + Bs \quad (11)$$

$$S2c = Rs + Gs \quad (12)$$

$$S2d = Rs + Gs + 2Bs \quad (13)$$

The image signal generating section 15 (see FIG. 6) generates color information by performing arithmetic operations on the photoelectrically converted signals represented by these Equations (10) through (13). Hereinafter, it will be described how the image signal generating section 15 performs such color information generation processing.

First of all, the image signal generating section 15 calculates (S2a−S2b), thereby calculating a signal 2Rs representing the intensity of a red ray. Next, the image signal generating section 15 calculates (S2d−S2c), thereby calculating a signal 2Bs representing the intensity of a blue ray. Then, the image signal generating section 15 calculates either (S2a+S2b) or (S2c+S2d), thereby obtaining a signal 2Rs+2Gs+2Bs (=2Ws) representing the intensity of the incoming light. After that, the image signal generating section 15 subtracts 2Rs and 2Bs from 2Rs+2Gs+2Bs thus obtained, thereby calculating a signal 2Gs representing the intensity of a green ray.

The image signal generating section 15 performs these signal arithmetic operations on each and every unit block 40 of the photosensitive cell array 2, thereby generating image signals representing RGB color components (which will be referred to herein as "color image signals"). The color image signals thus generated are output by the image signal output section 16 to a storage medium or display section (not shown).

In this manner, the image capture device of this preferred embodiment obtains color image signals by performing signal arithmetic processing on the photoelectrically converted signals S2a through S2d.

The signal arithmetic processing described above should also be applicable to a situation where the color filters 3b and 3c are not provided. Even so, color image signals could also be obtained. Actually, however, the dispersing performance of some of the dispersing elements could be slightly different from the ideal one due to either a property of the material used for the dispersing element or a poor precision of its manufacturing process. Specifically, if the dispersing performance of the dispersing element 1a is somewhat different from the ideal one, a part of the B ray (ΔB) may happen to be incident on the photosensitive cell 2a that faces the dispersing element 1a or parts of the R and G rays (ΔR+ΔG) may happen to be incident on the photosensitive cell 2b. In that case, a light ray represented by (R+G−ΔR−ΔG+ΔB) that has come from the dispersing element 1a is incident on the photosensitive cell 2a and a light ray represented by (B−ΔB+ΔR+ΔG) that has come from the dispersing element 1a is incident on the photosensitive cell 2b. The same can be said about the other dispersing elements. That is to say, if the precision of the manufacturing process of those dispersing elements is so poor that their dispersing performance is somewhat different from the expected one, the respective photoelectrically converted signals will also be slightly different from the ones represented by Equations (10) to (13) and the color reproducibility will decrease.

The image sensor of this preferred embodiment can overcome the color reproducibility problem by arranging color filters that face some of the pixels. Specifically, in the preferred embodiment described above, the Cy filter 3b is arranged to face the photosensitive cell 2b that should receive only G and B rays, and the Ye filter 3c is arranged to face the photosensitive cell 2c that should receive only R and G rays. As a result, although the quantity of the light incident on each of the photosensitive cells 2b and 2c decreases slightly, it is still possible to prevent either a light ray falling outside of the Cy wavelength range (i.e., an R ray) or a light ray falling outside of the Ye wavelength range (i.e., a B ray) from being incident on any of those photosensitive cells. By taking such a countermeasure, the signals S2b and S2c represented by Equations (11) and (12) come to have values that are close enough to their designed values. As a result, the color reproducibility can be improved. Optionally, a color filter that transmits the incoming light at an RGB ratio of two to one to one could be arranged to face the photosensitive cell 2a or a color filter that transmits the incoming light at an RGB ratio of one to one to two could be arranged to face the photosensitive cell 2d. If such a color filter were arranged, however, the quantity of the light to be received by the photosensitive cell that faces the color filter would decrease significantly. That is why such a color filter should not be arranged. After all, it is preferred that no color filters be arranged to face the photosensitive cells 2a and 2d and that color filters be arranged to face only the photosensitive cells 2b and 2c.

As described above, in the image capture device of this preferred embodiment, the image sensor 10 uses a unit block consisting of four pixels that are arranged in two columns and two rows, and four dispersing elements, which spatially disperse the incoming light according to the color component, are arranged to face those four pixels one to one. Specifically, a dispersing element 1a, which makes red and green rays incident on the pixel that faces itself and which also makes one and the other halves of a blue ray respectively incident on two pixels that are adjacent to the former pixel, is arranged at the row 1, column 1 position. A dispersing element 1b, which makes a green ray incident on the pixel that faces itself and which also makes red and blue rays respectively incident on two pixels that are adjacent to the former pixel, is arranged at the row 1, column 2 position and at the row 2, column 1 position. And a dispersing element 1d, which makes green and blue rays incident on the pixel that faces itself and which also makes one and the other halves of a red ray respectively incident on two pixels that are adjacent to the former pixel, is arranged at the row 2, column 2 position. Furthermore, a Cy filter is arranged between the photosensitive cell 2b at the row 1, column 2 position and the dispersing element 1b. And a Ye filter is arranged between the photosensitive cell 2c at the row 2, column 1 position and the dispersing element 1c. These color filters can prevent red and blue rays from being incident on the pixel at the row 1, column 2 position and on the pixel at the row 2, column 1 position, respectively. As a result, the decline in dispersing performance due to poor manufacturing precision of the dispersing element can be minimized and a color image capture device that has high sensitivity and high color reproducibility is realized, which is very beneficial.

It should be noted that the image signal generating section 15 does not always have to generate all of the three image signals representing the three color components. Alternatively, the image signal generating section 15 may also be designed to generate image signal(s) representing only one or two color components depending on the intended application. Also, if necessary, the signals may be amplified, synthesized or corrected as well.

Also, even if the color filters 3b and 3c are provided, the photoelectrically converted signals actually output from the respective photosensitive cells can still be somewhat different from the photoelectrically converted signals represented by Equations (10) to (13). In that case, by correcting the signals according to the magnitude of the difference, accurate color information can be obtained.

Optionally, the signal arithmetic operations performed by the image signal generating section 15 of this preferred embodiment may be performed by another device, not the image capture device itself. For example, the color information can also be generated by getting a program defining the signal arithmetic processing of this preferred embodiment executed by an external device that has been provided with the photoelectrically converted signals by the image sensor 10.

The basic structure of the image sensor 10 of this preferred embodiment is not limited to the one illustrated in FIGS. 9A to 9C. For example, the arrangements for the first and second columns shown in FIG. 9A may be changed with each other. Or the arrangements for the first and second rows shown in FIG. 9A may be changed with each other.

Furthermore, the dispersing elements do not always have to disperse the incoming light as in the example described above but the R, G and B rays could be changed with each other. For example, in the example described above, the R and G rays may be changed with each other or the G and B rays may be changed with each other.

It should be noted that the color filters 3b and 3c of this preferred embodiment do not have to be color filters that absorb a light ray falling within a particular wavelength range but could also be multilayer filters (dichroic mirrors) that reflect a light ray falling within a particular wavelength range.

Also, in the preferred embodiment described above, each of the dispersing elements 1a, 1b, 1c and 1d is designed so as to make a light ray incident on two pixels that are adjacent to the pixel that faces itself. However, each dispersing element may also be designed to make the light ray incident on only one pixel that is adjacent to the pixel that faces itself. For example, the dispersing element 1a may make almost all of the B ray, included in the light falling on the dispersing element 1a, incident on the photosensitive cell 2b. Likewise, the dispersing element 1b may make both of R and B rays incident on the photosensitive cell 2a. Even when any of these alternative arrangements is adopted, the same photoelectrically converted signals will be output by the respective photosensitive cells, and therefore, the same effect can be achieved as well.

In the preferred embodiment described above, an optical element that disperses incoming light into multiple light rays by taking advantage of a difference in refractive index between two members is used as the dispersing element. However, a dispersing element according to the present invention may be anything else as long as it can make a light ray with an intended color component incident on each photosensitive cell. For example, a micro prism or a dichroic mirror may also be used as the dispersing element. Furthermore, multiple different kinds of dispersing elements may also be used in combination as well.

Figure 10:
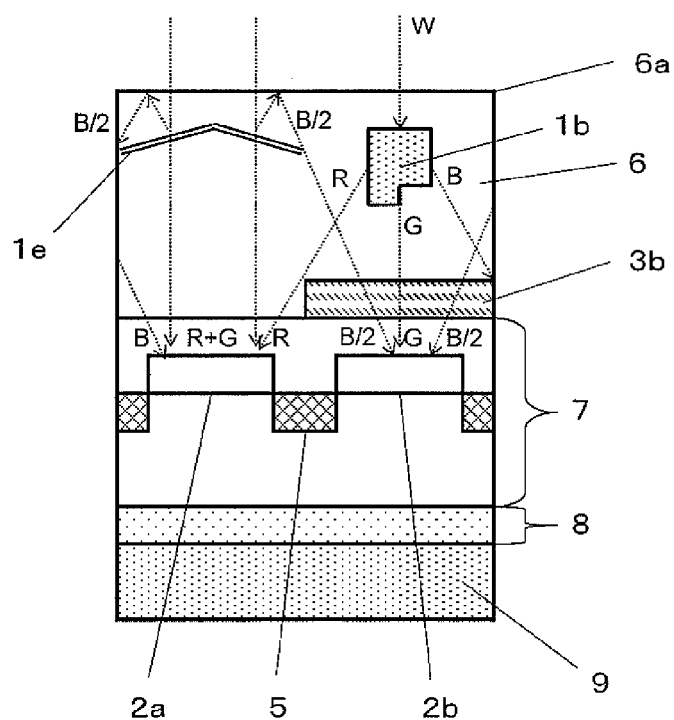
FIG. 10 is a cross-sectional view illustrating the basic structure of an image sensor as a modified example of the first preferred embodiment of the present invention.

As an example, an arrangement for an image sensor, a portion of which uses a dichroic mirror to transmit and reflect light, is illustrated in FIG. 10. Specifically, FIG. 10 illustrates an arrangement obtained by replacing the dispersing element 1a shown in FIG. 9B with a dispersing element 1e and omitting the micro lens 4. The dispersing element 1e includes two dichroic mirrors, each of which reflects a B ray and transmits the rest of the incoming light other than the B ray and which have been bonded together. The two dichroic mirrors are arranged so as to define a tilt angle with respect to a normal to the imaging area (i.e., arranged symmetrically to each other with respect to the normal). The tilt angle of these dichroic mirrors is defined so that the light reflected from the dichroic mirrors is totally reflected from the interface 6a between the transparent layer 6 and the micro lens 4 and then incident on two pixels that are adjacent to the pixel that faces these dichroic mirrors. Even when such an arrangement is adopted, color information can also be obtained by performing the signal arithmetic operations described above.

Embodiment 2

Next, a second specific preferred embodiment of the present invention will be described with reference to FIGS. 11A through 11C. The image capture device of this preferred embodiment has the same configuration as the counterpart of the first preferred embodiment described above except for the structure of the image sensor 10. Thus, the following description of this second preferred embodiment will be focused on only the difference from the first preferred embodiment and description of their common features will be omitted herein.

Figure 11A:
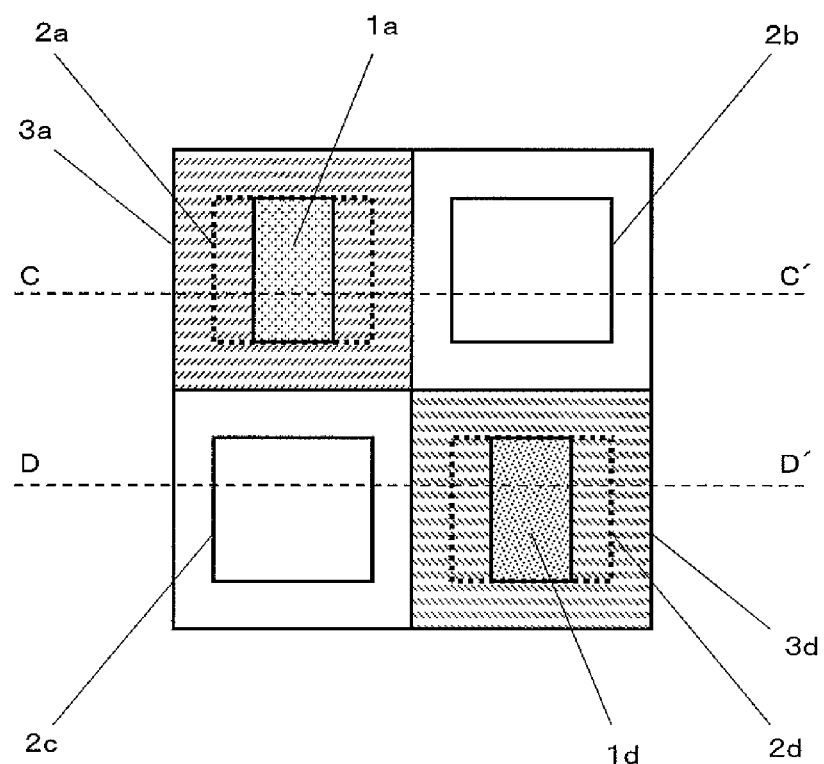
FIG. 11A is a plan view illustrating an exemplary basic structure for an image sensor according to a second preferred embodiment of the present invention.

FIG. 11A is a plan view illustrating the basic structure of the image sensor 10 of this preferred embodiment. In each unit block 40, two dispersing elements 1a and 1d are arranged so as to respectively face two 2a and 2d out of the four photosensitive cells 2a, 2b, 2c and 2d. The dispersing elements 1a and 1d have the same property as the dispersing elements 1a and 1d of the first preferred embodiment described above. A color filter (Ye filter) 3a, which absorbs a light ray falling within the blue wavelength range but transmits light rays falling within the red and green wavelength ranges, is arranged between the photosensitive cell 2a at the row 1, column 1 position and the dispersing element 1a. Also, a color filter (Cy filter) 3d, which absorbs a light ray falling within the red wavelength range but transmits light rays falling within the green and blue wavelength ranges, respectively, is arranged between the photosensitive cell 2d at the row 2, column 2 position and the dispersing element 1d. No dispersing elements or color filters are arranged to face the photosensitive cells at the row 1, column 2 position and at the row 2, column 2 position. A number of basic structures, each having the same arrangement pattern like this, are arranged over the entire imaging area 10a.

Figure 11B:
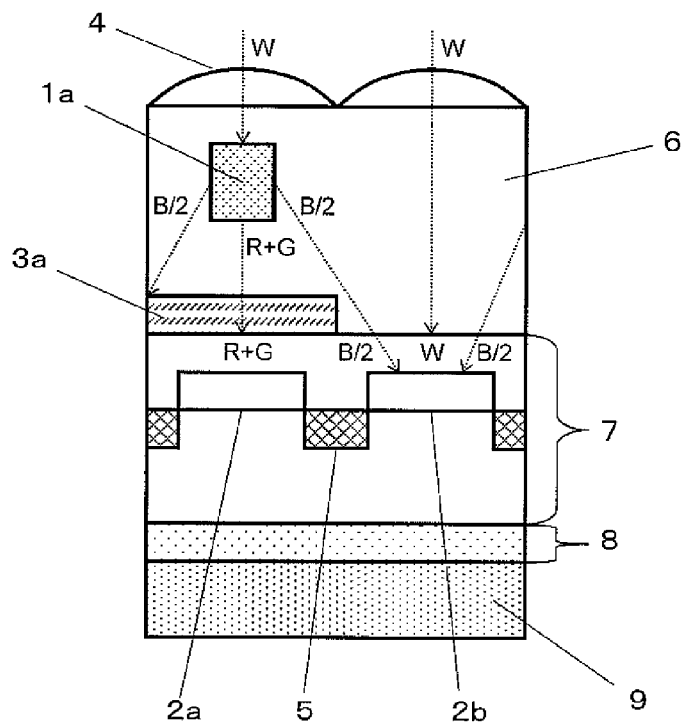
FIG. 11B is a cross-sectional view thereof as viewed on the plane CC' shown in FIG. 11A.

FIG. 11B is a cross-sectional view of the image sensor 10 as viewed on the plane CC' shown in FIG. 11A. As shown in FIG. 11B, the dispersing element 1a makes R and G rays incident on the photosensitive cell 2a that faces itself and also makes one and the other halves of a B ray incident on the photosensitive cell 2b and on a photosensitive cell of an adjacent unit block, respectively. As no color filters or dispersing elements are arranged to face the photosensitive cell 2b, W light is also incident directly on the photosensitive cell 2b without passing through any dispersing element.

Figure 11C:
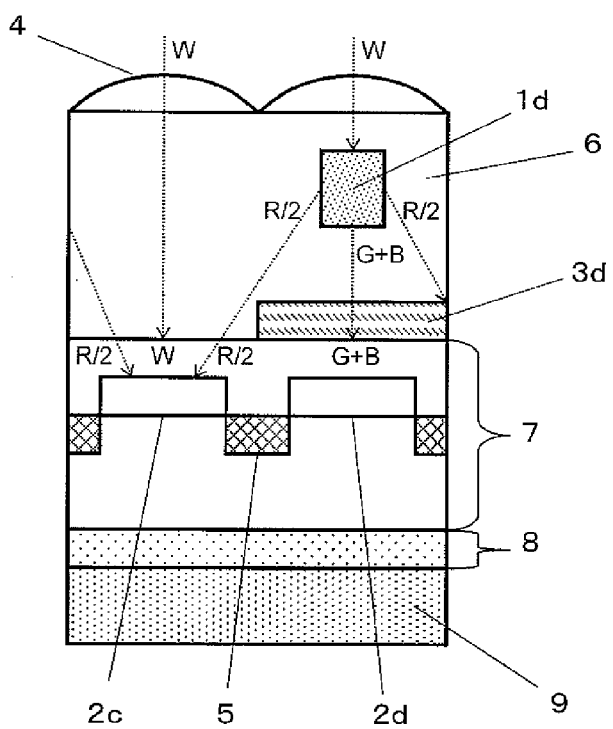
FIG. 11C is a cross-sectional view thereof as viewed on the plane DD' shown in FIG. 11A.

FIG. 11C is a cross-sectional view of the image sensor 10 as viewed on the plane DD' shown in FIG. 11A. As shown in FIG. 11C, the dispersing element 1d makes G and B rays incident on the photosensitive cell 2d that faces itself and also makes one and the other halves of an R ray incident on the photosensitive cell 2c and on a photosensitive cell of an adjacent unit block, respectively. As no color filters or dispersing elements are provided for the photosensitive cell 2c, W light is also incident directly on the photosensitive cell 2c without passing through any dispersing element.

The image sensor 10 of this preferred embodiment also has a backside illumination structure in which light is incident on the other side of the device opposite to the interconnect layer 5. However, the image sensor 10 does not have to have such a backside illumination structure but may also have a surface illumination structure.

With such an arrangement adopted, when incoming light strikes this image sensor 10, the photosensitive cell 2a receives R and G rays from the dispersing element 1a by way of the Ye filter 3a. The photosensitive cell 2b receives not only W light that has been incident directly on it without passing through any dispersing element but also one and the other halves of a B ray from the dispersing element 1a and from a dispersing element that faces a photosensitive cell belonging to an adjacent unit block, respectively. The photosensitive cell 2c receives not only W light that has been incident directly on it without passing through any dispersing element but also one and the other halves of an R ray from the dispersing element 1d and from a dispersing element that faces a photosensitive cell belonging to another adjacent unit block, respectively. And the photosensitive cell 2d receives G and B rays from the dispersing element 1d by way of the Cy filter 3d. As a result, the photoelectrically converted signals 2a through 2d output from the respective photosensitive cells can be represented by the following Equations (14) to (17), respectively:

$$S2a = Rs + Gs \quad (14)$$

$$S2b = Rs + Gs + 2Bs \quad (15)$$

$$S2c = 2Rs + Gs + Bs \quad (16)$$

$$S2d = Gs + Bs \quad (17)$$

The image signal generating section 15 (see FIG. 6) generates color information by performing arithmetic operations on the photoelectrically converted signals represented by these Equations (14) through (17). First of all, the image signal generating section 15 calculates (S2b−S2a), thereby calculating a signal 2Bs representing the intensity of a blue ray. Next, the image signal generating section 15 calculates (S2c−S2d), thereby calculating a signal 2Rs representing the intensity of a red ray. Then, the image signal generating section 15 calculates either (S2a+S2b) or (S2c+S2d), thereby obtaining a signal 2Rs+2Gs+2Bs (=2Ws) representing the intensity of the incoming light. After that, the image signal generating section 15 subtracts 2Rs and 2Bs from 2Rs+2Gs+2Bs thus obtained, thereby calculating a signal 2Gs representing the intensity of a green ray.

The image signal generating section 15 performs these signal arithmetic operations on each and every unit block 40 of the photosensitive cell array 200, thereby generating image signals representing RGB color components (which will be referred to herein as "color image signals"). The color image signals thus generated are output by the image signal output section 16 to a storage medium or display section (not shown). In this manner, the image capture device of this preferred embodiment obtains color image signals by performing signal arithmetic processing on the photoelectrically converted signals S2a through S2d.

The signal arithmetic processing described above should also be applicable to a situation where the color filters 3a and 3d are not provided. Even so, color image signals could also be obtained. Actually, however, the dispersing performance of some of the dispersing elements could be slightly different from the ideal one due to either a property of the material used for the dispersing elements or a poor precision of its manufacturing process. If the dispersing performance of each dispersing element is somewhat different from the expected one, the respective photoelectrically converted signals will also be slightly different from the ones represented by Equations (14) to (17) and the color reproducibility will decrease.

The image sensor of this preferred embodiment can overcome the color reproducibility problem by arranging color filters that face some of the pixels. Specifically, in the preferred embodiment described above, the Ye filter 3a is arranged to face the photosensitive cell 2a that should receive only R and G rays and the Cy filter 3d is arranged to face the photosensitive cell 2d that should receive only G and B rays. As a result, it is possible to prevent either a light ray falling outside of the Ye wavelength range (i.e., a B ray) or a light ray falling outside of the Cy wavelength range (i.e., an R ray) from being incident on any of those photosensitive cells. By taking such a countermeasure, the signals S2a and S2d represented by Equations (14) and (17) come to have values that are close enough to their designed values. As a result, the color reproducibility can be improved.

As described above, in the image capture device of this preferred embodiment, the image sensor 10 uses a unit block consisting of four pixels that are arranged in two columns and two rows, and two dispersing elements, which spatially disperse the incoming light according to the color component, are arranged to face one to one the pixel at the row 1, column 1 position and the pixel at the row 2, column 2 position, respectively. Specifically, a dispersing element 1a, which makes red and green rays incident on the pixel that faces itself and which also makes one and the other halves of a blue ray respectively incident on two pixels that are adjacent to the former pixel, is arranged at the row 1, column 1 position. No dispersing elements are arranged to face the pixel at the row 1, column 2 position and the pixel at the row 2, column 1 position. And a dispersing element 1d, which makes green and blue rays incident on the pixel that faces itself and which also makes one and the other halves of a red ray respectively incident on two pixels that are adjacent to the former pixel, is arranged at the row 2, column 2 position. Furthermore, a Ye filter 3a is arranged between the photosensitive cell 2a at the row 1, column 1 position and the dispersing element 1a and a Cy filter 3d is arranged between the photosensitive cell 2d at the row 2, column 2 position and the dispersing element 1d. These color filters can prevent blue and red rays from being incident on the pixel at the row 1, column 1 position and on the pixel at the row 2, column 2 position, respectively. As a result, the decline in dispersing performance due to poor manufacturing precision of the dispersing elements can be minimized and a color image capture device that has high sensitivity and high color reproducibility is realized, which is very beneficial.

The basic structure of the image sensor 10 of this preferred embodiment is not limited to the one illustrated in FIGS. 11A to 11C. For example, the arrangements for the first and second columns shown in FIG. 11A may be changed with each other. Or the arrangements for the first and second rows shown in FIG. 11A may be changed with each other.

Furthermore, the dispersing elements do not always have to disperse the incoming light as in the example described above but the R, G and B rays could be changed with each other. For example, in the example described above, the R and G rays may be changed with each other or the G and B rays may be changed with each other.

Also, in the preferred embodiment described above, each of the dispersing elements 1a and 1d is designed so as to make a light ray incident on two pixels that are adjacent to the pixel that faces itself. However, each dispersing element may also be designed to make the light ray incident on only one pixel that is adjacent to the pixel that faces itself. For example, the dispersing element 1a may make almost all of the B ray, included in the light falling on the dispersing element 1a, incident on the photosensitive cell 2b. Likewise, the dispersing element 1d may make almost all of the R ray, included in the light falling on the dispersing element 1d, incident on the photosensitive cell 2c. Even when any of these alternative arrangements is adopted, the same photoelectrically converted signals will be output by the respective photosensitive cells, and therefore, the same effect can be achieved as well.

In this preferred embodiment, the dispersing element may be anything as long as it can make a light ray with an intended color component incident on each photosensitive cell. For example, a micro prism or a dichroic mirror may also be used as the dispersing element. Furthermore, multiple different kinds of dispersing elements may also be used as the dispersing elements 1a and 1d. Moreover, the color filters 3a and 3d do not have to be color filters that absorb a light ray falling within a particular wavelength range but may also be dichroic mirrors that reflect a light ray falling within a particular wavelength range.

Embodiment 3

Next, a third specific preferred embodiment of the present invention will be described with reference to FIGS. 12A through 12C. The image capture device of this preferred embodiment has the same configuration as the counterpart of the first preferred embodiment described above except the structure of the image sensor 10. Thus, the following description of this third preferred embodiment will be focused on only the difference from the first preferred embodiment and description of their common features will be omitted herein.

Figure 12A:
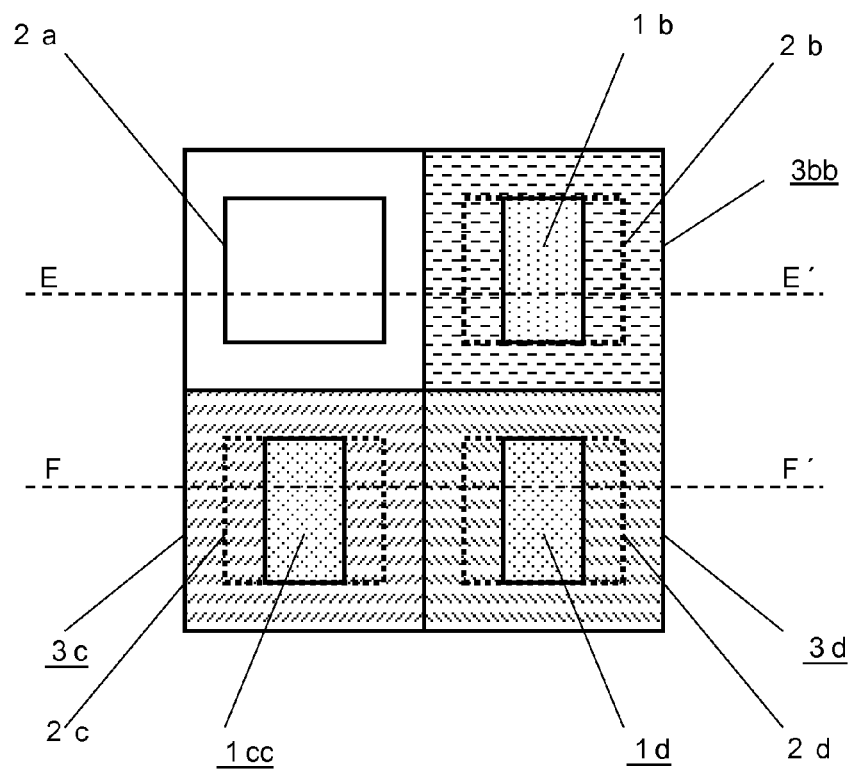
FIG. 12A is a plan view illustrating an exemplary basic structure for an image sensor according to the third preferred embodiment of the present invention.

FIG. 12A is a plan view illustrating the basic structure of the image sensor 10 of this preferred embodiment. In each unit block 40, three dispersing elements 1b, 1cc and 1d are arranged so as to respectively face three 2b, 2c and 2d out of the four photosensitive cells 2a, 2b, 2c and 2d. The dispersing elements 1b and 1d have the same property as the dispersing elements 1b and 1d of the first preferred embodiment described above. The dispersing element 1cc has the same property as the dispersing element 1a of the first and second preferred embodiments described above. A color filter (G filter) 3bb, which absorbs light rays falling within the red and blue wavelength ranges but transmits a light ray falling within the green wavelength range, is arranged between the photosensitive cell 2b at the row 1, column 2 position and the dispersing element 1b. A color filter (Ye filter) 3c, which absorbs a light ray falling within the blue wavelength range but transmits light rays falling within the red and green wavelength ranges, is arranged between the photosensitive cell 2c at the row 2, column 1 position and the dispersing element 1cc. Also, a color filter (Cy filter) 3d, which absorbs a light ray falling within the red wavelength range but transmits light rays falling within the green and blue wavelength ranges, respectively, is arranged between the photosensitive cell 2d at the row 2, column 2 position and the dispersing element 1d. No dispersing element or color filter is arranged to face the photosensitive cell 2a at the row 1, column 1 position. A number of basic structures, each having the same arrangement pattern like this, are arranged over the entire imaging area 10a.

Figure 12B:
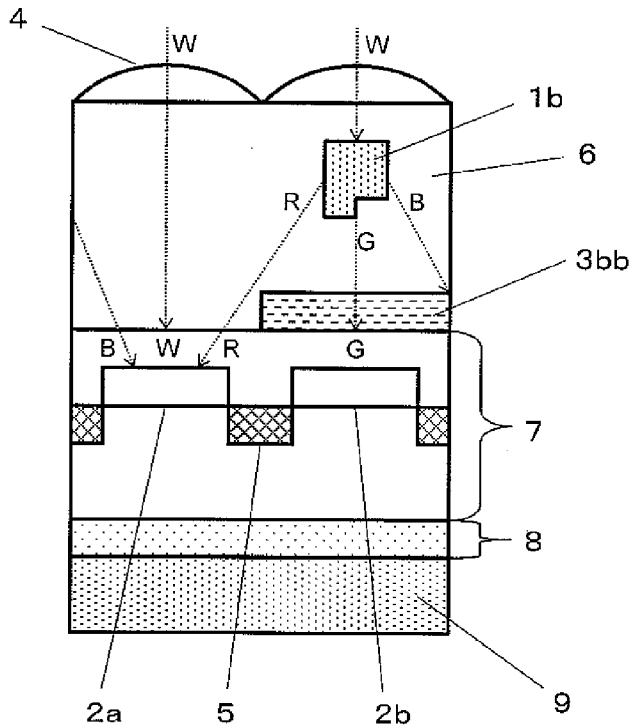
FIG. 12B is a cross-sectional view thereof as viewed on the plane CC' shown in FIG. 11A.

FIG. 12B is a cross-sectional view of the image sensor 10 as viewed on the plane EE' shown in FIG. 12A. As shown in FIG. 12B, the dispersing element 1b makes a G ray incident on the photosensitive cell 2b that faces itself, makes a R ray incident on the photosensitive cell 2a and makes a B ray incident on a photosensitive cell of an adjacent unit block (which will be referred to herein as a "first adjacent unit block"). As no color filter or dispersing element is arranged to face the photosensitive cell 2a, W light is also incident directly on the photosensitive cell 2a without passing through any dispersing element.

Figure 12C:
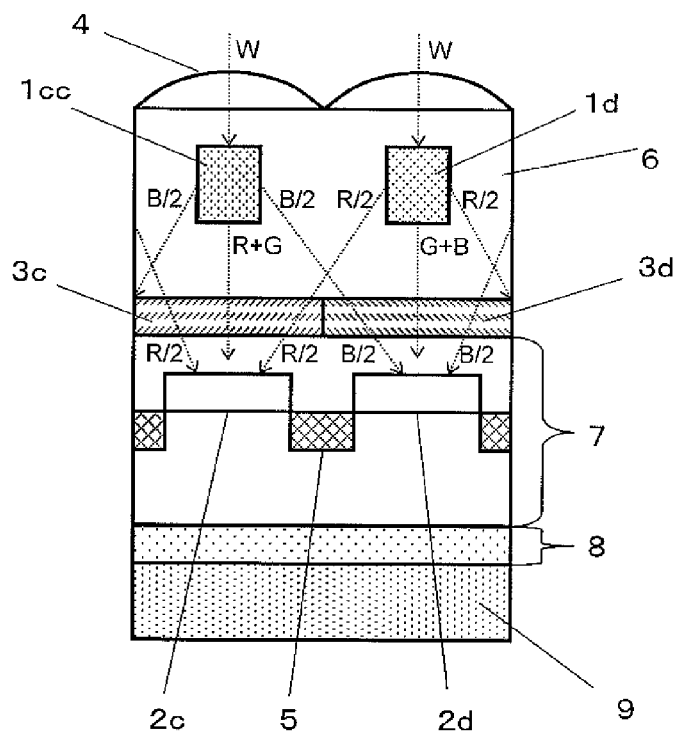
FIG. 12C is a cross-sectional view thereof as viewed on the plane DD' shown in FIG. 11A.
Figure 13:
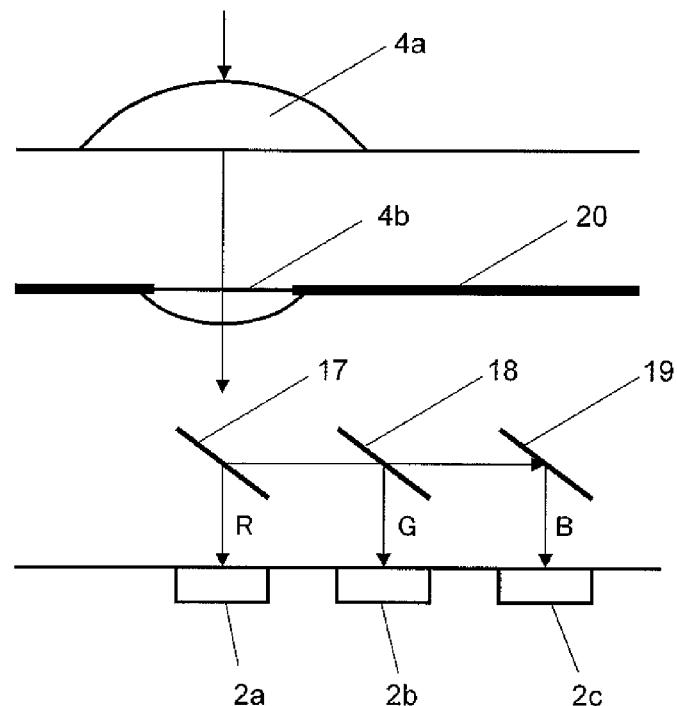
FIG. 13 is a cross-sectional view illustrating a conventional image sensor that uses micro lenses and multilayer filters (dichroic mirrors).
Figure 14:
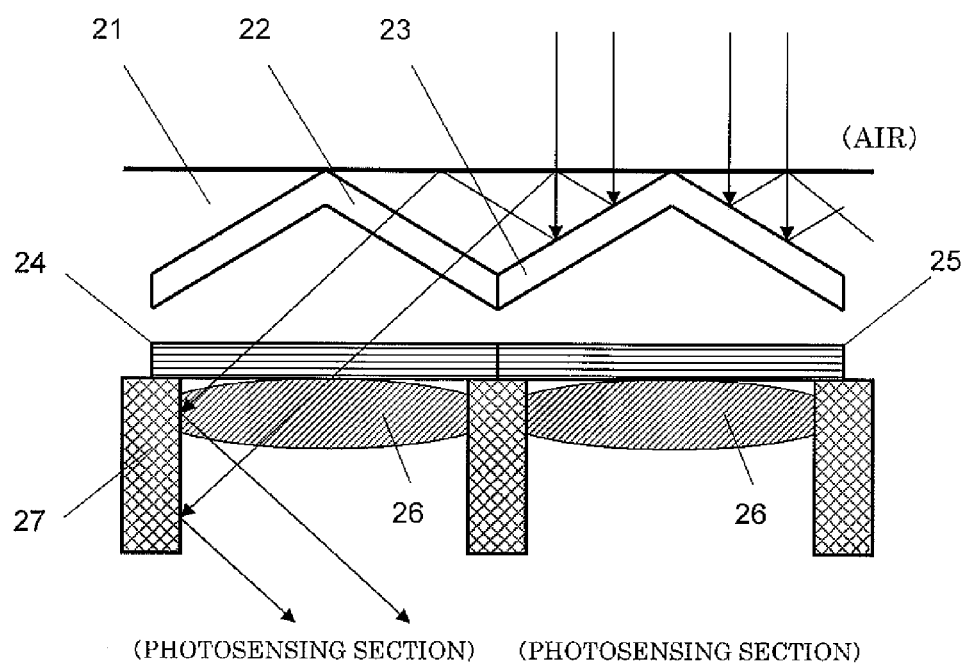
FIG. 14 is a cross-sectional view of another conventional image sensor that uses reflection by multilayer filters (dichroic mirrors).

FIG. 12C is a cross-sectional view of the image sensor 10 as viewed on the plane FF' shown in FIG. 12A. As shown in FIG. 12C, the dispersing element 1cc makes R and G rays incident on the photosensitive cell 2c that faces itself and also makes one and the other halves of a B ray incident on the photosensitive cell 2d and on a photosensitive cell of an adjacent unit block (which will be referred to herein as a "second adjacent unit block"), respectively. And the dispersing element 1d makes G and B rays incident on the photosensitive cell 2d that faces itself and also makes one and the other halves of an R ray incident on the photosensitive cell 2c and on a photosensitive cell of the first adjacent unit block, respectively.

The image sensor 10 of this preferred embodiment also has a backside illumination structure in which light is incident on the other side of the device opposite to the interconnect layer 5. However, the image sensor 10 does not have to have such a backside illumination structure but may also have a surface illumination structure.

With such an arrangement adopted, when incoming light strikes this image sensor 10, the photosensitive cell 2a receives not only W light that has been incident directly on it without passing through any dispersing element but also R and B rays from the dispersing element 1b and from a dispersing element that faces a photosensitive cell belonging to the second adjacent unit block, respectively. The photosensitive cell 2b receives a G ray from the dispersing element 1b by way of the G filter 3bb. The photosensitive cell 2c receives not only R and G rays from the dispersing element 1cc by way of the Ye filter 3c but also one and the other halves of an R ray from the dispersing element 1d and from a dispersing element that faces a photosensitive cell belonging to the second adjacent unit block, respectively. And the photosensitive cell 2d receives not only G and B rays from the dispersing element 1d by way of the Ye filter 3d but also one and the other halves of a B ray from the dispersing element 1c and from a dispersing element that faces a photosensitive cell belonging to the first adjacent unit block, respectively. As a result, the photoelectrically converted signals 2a through 2d output from the respective photosensitive cells can be represented by the following Equations (18) to (21), respectively:

$$S2a = 2Rs + Gs + 2Bs \tag{18}$$

$$S2b = Gs \tag{19}$$

$$S2c = 2Rs + Gs \tag{20}$$

$$S2d = Gs + 2Bs \tag{21}$$

The image signal generating section 15 (see FIG. 6) generates color information by performing arithmetic operations on the photoelectrically converted signals represented by these Equations (18) through (21). First of all, the image signal generating section 15 calculates (S2a−S2b), thereby calculating 2(Rs+Bs). Next, the image signal generating section 15 calculates (S2c−S2d), thereby calculating 2(Rs−Bs).

Then, the image signal generating section 15 adds together 2(Rs+Bs) and 2(Rs−Bs) thus obtained, thereby generating a signal 4Rs representing the intensity of a red ray. Also, the image signal generating section 15 subtracts 2(Rs−Bs) from 2(Rs+Bs), thereby generating a signal 4Bs representing the intensity of a blue ray. Thereafter, the image signal generating section 15 calculates either (S2a+S2b) or (S2c+S2d), thereby obtaining a signal 2Rs+2Gs+2Bs (=2Ws) representing the intensity of the incoming light. After that, the image signal generating section 15 subtracts 2Rs and 2Bs from 2Rs+2Gs+2Bs thus obtained, thereby calculating a signal 2Gs representing the intensity of a green ray.

The image signal generating section 15 performs these signal arithmetic operations on each and every unit block 40 of the photosensitive cell array 200, thereby generating image signals representing RGB color components (which will be referred to herein as "color image signals"). The color image signals thus generated are output by the image signal output section 16 to a storage medium or display section (not shown). In this manner, the image capture device of this preferred embodiment obtains color image signals by performing signal arithmetic processing on the photoelectrically converted signals S2a through S2d.

The signal arithmetic processing described above should also be applicable to a situation where the color filters 3bb, 3c and 3d are not provided. Even so, color image signals could also be obtained. Actually, however, the dispersing performance of some of the dispersing elements could be slightly different from the ideal one due to either a property of the material used for the dispersing elements or a poor precision of its manufacturing process. If the dispersing performance of each dispersing element is somewhat different from the expected one, the respective photoelectrically converted signals will also be slightly different from the ones represented by Equations (18) to (21) and the color reproducibility will decrease.

The image sensor of this preferred embodiment can overcome the color reproducibility problem by arranging color filters that face some of the pixels. Specifically, in the preferred embodiment described above, the G filter 3bb is arranged to face the photosensitive cell 2b that should receive only a G ray. The Ye filter 3c is arranged to face the photosensitive cell 2c that should receive only R and G rays. And the Cy filter 3d is arranged to face the photosensitive cell 2d that should receive only G and B rays. As a result, it is possible to prevent a G ray, a Ye ray (i.e., sum of R and G rays) and a Cy ray (i.e., sum of G and B rays) from being incident on the photosensitive cells 2b, 2c and 2d, respectively. By taking such a countermeasure, the signals S2a, S2c and S2d represented by Equations (19) to (21) come to have values that are close enough to their designed values. As a result, the color reproducibility can be improved.

As described above, in the image capture device of this preferred embodiment, the image sensor 10 uses a unit block consisting of four pixels that are arranged in two columns and two rows, and three dispersing elements, which spatially disperse the incoming light according to the color component, are arranged to face one to one three pixels at the row 1, column 2 position, at the row 2, column 1 position, and at the row 2, column 2 position, respectively. No dispersing element is provided for the pixel at the row 1, column 1 position. Specifically, a dispersing element 1b, which makes a G ray incident on the pixel that faces itself and which also makes R and B rays respectively incident on the two pixels that are adjacent to the former pixel, is arranged at the row 1, column 2 position. A dispersing element 1cc, which makes red and green rays incident on the pixel that faces itself and which also makes one and the other halves of a blue ray respectively incident on two pixels that are adjacent to the former pixel, is arranged at the row 2, column 1 position. And a dispersing element 1d, which makes green and blue rays incident on the pixel that faces itself and which also makes one and the other halves of a red ray respectively incident on two pixels that are adjacent to the former pixel, is arranged at the row 2, column 2 position. Furthermore, a G filter is arranged between the photosensitive cell 2b at the row 1, column 2 position and the dispersing element 1b, a Ye filter 3c is arranged between the photosensitive cell 2c at the row 2, column 1 position and the dispersing element 1cc, and a Cy filter 3d is arranged between the photosensitive cell 2d at the row 2, column 2 position and the dispersing element 1d. These color filters can prevent red and blue rays from being incident on the pixel at the row 1, column 2 position, and can also prevent a blue ray from being incident on the pixel at the row 2, column 1 position, and can further prevent a red ray from being incident on the pixel at the row 2, column 2 position. As a result, the decline in dispersing performance due to poor manufacturing precision of the dispersing elements can be minimized and a color image capture device that has high sensitivity and high color reproducibility is realized, which is very beneficial.

In the preferred embodiment described above, in each unit block consisting of four pixels that are arranged in two columns and two rows, both the dispersing element 1b and the G filter 3bb are arranged to face the pixel at the row 1, column 2 position. However, only one of the dispersing element 1b and the G filter 3bb may be arranged to face it. Even so, color representation is also realized by performing similar processing to what has already been described. Nevertheless, if only the G filter 3bb is arranged without providing the dispersing element 1b, the photoelectrically converted signal of the photosensitive cell 2a will be represented as S2a=Rs+Gs+Bs. That is why (S2a−S2b) becomes equal to (Rs+Bs), and therefore, the rest of the signal processing needs to be carried out using a signal obtained by doubling the result.

The basic structure of the image sensor 10 of this preferred embodiment is not limited to the one illustrated in FIGS. 12A to 12C. For example, the arrangements for the first and second columns shown in FIG. 12A may be changed with each other. Or the arrangements for the first and second rows shown in FIG. 12A may be changed with each other.

Furthermore, the dispersing elements do not always have to disperse the incoming light as in the example described above but the R, G and B rays could be changed with each other. For example, in the example described above, the R and G rays may be changed with each other or the G and B rays may be changed with each other.

Also, in the preferred embodiment described above, each of the dispersing elements 1b, 1cc and 1d is designed so as to make a light ray incident on two pixels that are adjacent to the pixel that faces itself. However, each dispersing element may also be designed to make the light ray incident on only one pixel that is adjacent to the pixel that faces itself. For example, the dispersing element 1c may make almost all of the B ray, included in the light falling on the dispersing element 1c, incident on the photosensitive cell 2d. Likewise, the dispersing element 1d may make almost all of the R ray, included in the light falling on the dispersing element 1d, incident on the photosensitive cell 2a. Even when any of these alternative arrangements is adopted, the same photoelectrically converted signals will be output by the respective photosensitive cells, and therefore, the same effect can be achieved as well.

In this preferred embodiment, the dispersing element may be anything as long as it can make a light ray with an intended color component incident on each photosensitive cell. For example, a micro prism or a dichroic mirror may also be used as the dispersing element. Furthermore, multiple different kinds of dispersing elements may also be used as the dispersing elements 1a and 1d. Moreover, the color filters 3b, 3c and 3d do not have to be color filters that absorb a light ray falling within a particular wavelength range but may also be dichroic mirrors that reflect a light ray falling within a particular wavelength range.

INDUSTRIAL APPLICABILITY

The solid-state image sensor and image capture device of the present invention can be used effectively in every camera that ever uses a solid-state image sensor, and may be used in digital still cameras, digital camcorders and other consumer electronic cameras and in industrial surveillance cameras, to name just a few.

REFERENCE SIGNS LIST 1a, 1a", 1aa, 1aa', 1bb', 1b, 1c, 1d, 1e, 1cc dispersing element
2, 2a, 2b, 2c, 2d, 2a', 2b' image sensor's photosensitive cell
3a, 3b, 3c, 3d, 3a', 3aa, 3bb color filter
4, 4a, 4b micro lens
5 image sensor's interconnect layer
6 transparent layer
6a interface between transparent layer and external layer
7 semiconductor substrate
8 adhesive layer
9 supporting base
10 image sensor
10a image sensor's imaging area
11 optical filter
12 optical lens
13 signal generating and pixel signal receiving section
14 sensor driving section
15 image signal generating section
16 image signal output section
17 multilayer filter that reflects every ray but red (R) ray
18 multilayer filter that reflects only green (G) ray
19 multilayer filter that reflects only blue (B) ray
20 opaque portion
21 light-transmitting resin
22 G-ray-transmitting multilayer filter
23 R-ray-transmitting multilayer filter
24 G-ray-transmitting organic dye filter
25 R-ray-transmitting organic dye filter
26 micro lens
27 metal layer
28 memory
29 unit block
100 dispersing element array
200 photosensitive cell array
300 color filter array
400 signal processing section
500 image capturing section

The invention claimed is:
1. A solid-state image sensor comprising:
    a photosensitive cell array, in which a number of unit blocks, each including first and second photosensitive cells, are arranged two-dimensionally on an imaging area,
    a dispersing element array that is arranged so as to face the photosensitive cell array and that includes a plurality of dispersing elements, and
    a color filter array that is arranged between the photosensitive cell array and the dispersing element array, and that includes a plurality of color filters,
    wherein if light that would be directly incident on each said photosensitive cell, were it not for the dispersing element array and the color filter array, is called that photosensitive cell's entering light and if the first photosensitive cell's entering light includes light rays that fall within first, second and third wavelength ranges,
    the dispersing element array includes a first dispersing element that is arranged to face the first photosensitive cell and that makes at least a part of the light rays falling within the first wavelength range included in the first cell's entering light incident on the second photosensitive cell, and the dispersing element array is designed to make light rays falling within at least two ranges of the first wavelength range, the second wavelength range and the third wavelength range incident on at least one of the first and second photosensitive cells, and
    the color filter array includes a first color filter that is arranged between the first photosensitive cell and the first dispersing element, and that either absorbs or reflects the light rays falling within the first wavelength range.

2. The solid-state image sensor of claim 1, wherein the first dispersing element makes a part of the light rays falling within the first wavelength range included in the first photosensitive cell's entering light incident on the second photosensitive cell and another part of the light rays falling within the first wavelength range included in the first photosensitive cell's entering light incident on the second photosensitive cell of an adjacent unit block.

3. The solid-state image sensor of claim 1, further comprising a second dispersing element that is arranged to face the second photosensitive cell,
    wherein the first dispersing element makes the light ray that falls within the first wavelength range incident on the second photosensitive cell, makes the light ray that falls within the second wavelength range incident on the second photosensitive cell of an adjacent unit block, and makes the light ray that falls within the third wavelength range incident on its associated first photosensitive cell, and
    wherein the second dispersing element makes a part of the light rays falling within the second wavelength range that are included in the second photosensitive cell's entering light incident on its associated first photosensitive cell, makes another part of the light rays falling within the second wavelength range that are included in the second photosensitive cell's entering light incident on the first photosensitive cell of another adjacent unit block, and makes the light rays falling within the first and third wavelength ranges incident on its associated second photosensitive cell.

4. The solid-state image sensor of claim 3, wherein each said unit block further includes third and fourth photosensitive cells, and
    wherein the dispersing element array further includes:
    a third dispersing element arranged to face the third photosensitive cell, the third dispersing element making light rays falling within one of the first and second wavelength ranges that are included in the third photosensitive cell's entering light incident on its associated fourth photosensitive cell, making light rays falling within the other one of the first and second wavelength ranges that are included in the third photosensitive cell's entering light incident on the fourth photosensitive cell of that another adjacent unit block, and making light rays falling within the third wavelength range incident on its associated third photosensitive cell; and a fourth dispersing element arranged to face the fourth photosensitive cell, the fourth dispersing element making a part of the light rays falling within the first wavelength range that are included in the fourth photosensitive cell's entering light incident on its associated third photosensitive cell, making another part of the light rays falling within the first wavelength range that are included in the fourth photosensitive cell's entering light incident on the third photosensitive cell of the adjacent unit block, and making light rays falling within the second and third wavelength ranges incident on its associated fourth photosensitive cell, and wherein the color filter array includes a second color filter that is arranged between the third photosensitive cell and the third dispersing element, and that either absorbs or reflects the light ray falling within the second wavelength range.

5. The solid-state image sensor of claim 2, wherein each said unit block further includes third and fourth photosensitive cells, and wherein the dispersing element array further includes a second dispersing element arranged to face the fourth photosensitive cell, the second dispersing element making a part of the light rays falling within the second wavelength range that are included in the fourth photosensitive cell's entering light incident on its associated third photosensitive cell, making another part of the light rays falling within the second wavelength range that are included in the fourth photosensitive cell's entering light incident on the third photosensitive cell of another adjacent unit block, and making light rays falling within the first and third wavelength ranges incident on its associated fourth photosensitive cell, and wherein the color filter array includes a second color filter that is arranged between the fourth photosensitive cell and the second dispersing element, and that either absorbs or reflects the light ray falling within the second wavelength range.

6. The solid-state image sensor of claim 2, wherein each said unit block further includes third and fourth photosensitive cells, and wherein the dispersing element array further includes:

a second dispersing element arranged to face the second photosensitive cell, the second dispersing element making a part of the light rays falling within the second wavelength range that are included in the second photosensitive cell's entering light incident on its associated first photosensitive cell, making another part of light rays falling within the second wavelength range that are included in the second photosensitive cell's entering light incident on the first photosensitive cell of another adjacent unit block, and making light rays falling within the first and third wavelength ranges incident on its associated second photosensitive cell; and a third dispersing element arranged to face the third photosensitive cell, the third dispersing element making light rays falling within one of the first and second wavelength ranges that are included in the third photosensitive cell's entering light incident on its associated fourth photosensitive cell, making light rays falling within the other one of the first and second wavelength ranges that are included in the third photosensitive cell's entering light incident on the fourth photosensitive cell of the adjacent unit block, and making the light ray falling within the third wavelength range incident on its associated third photosensitive cell, and wherein the color filter array includes a second color filter that is arranged between the second photosensitive cell and the second dispersing element, and that either absorbs or reflects the light ray falling within the second wavelength range.

7. The solid-state image sensor of claim 6, wherein the color filter array includes a third color filter that is arranged between the third photosensitive cell and the third dispersing element, and that either absorbs or reflects the light rays respectively falling within the first and second wavelength ranges.

8. The solid-state image sensor of claim 2, wherein each said unit block further includes third and fourth photosensitive cells, and wherein the dispersing element array further includes a second dispersing element arranged to face the second photosensitive cell, the second dispersing element making a part of the light rays falling within the second wavelength range that are included in the second photosensitive cell's entering light incident on its associated first photosensitive cell, making another part of the light rays falling within the second wavelength range that are included in the second photosensitive cell's entering light incident on the first photosensitive cell of another adjacent unit block, and making light rays falling within the first and third wavelength ranges incident on its associated second photosensitive cell, and wherein the color filter array includes:

a second color filter that is arranged between the second photosensitive cell and the second dispersing element, and that either absorbs or reflects the light rays falling within the second wavelength range; and a third color filter that is arranged between the third photosensitive cell and the third dispersing element, and that either absorbs or reflects the light rays that respectively fall within the first and second wavelength ranges.

9. The solid-state image sensor of claim 1, wherein the first wavelength range belongs to one of red and blue ranges, the second wavelength range belongs to the other of the red and blue ranges, and the third wavelength range belongs to a green range.

10. The solid-state image sensor of claim 1, wherein each of the dispersing elements of the dispersing element array has a light-transmitting member, and disperses the incoming light by using a difference in refractive index between that light-transmitting member and another light-transmitting member that has a lower refractive index than the former light-transmitting member.

11. An image capture device comprising:

the solid-state image sensor of claim 1;

an optical system that forms an image on the solid-state image sensor; and a signal processing section that processes signals supplied from the solid-state image sensor and generates color information.

* * * * *